US009029691B2

United States Patent
Yoshida et al.

(10) Patent No.: US 9,029,691 B2
(45) Date of Patent: May 12, 2015

(54) SOLAR-CELL-INTEGRATED GAS PRODUCTION DEVICE

(75) Inventors: Akihito Yoshida, Osaka (JP); Masaki Kaga, Osaka (JP); Shunsuke Sata, Osaka (JP)

(73) Assignee: Sharp Kabushiki Kaisha, Osaka-sh, Osaka (JP)

( * ) Notice: Subject to any disclaimer, the term of this patent is extended or adjusted under 35 U.S.C. 154(b) by 424 days.

(21) Appl. No.: 13/698,774

(22) PCT Filed: Apr. 7, 2011

(86) PCT No.: PCT/JP2011/058811
§ 371 (c)(1), (2), (4) Date: Nov. 19, 2012

(87) PCT Pub. No.: WO2011/145406
PCT Pub. Date: Nov. 24, 2011

(65) Prior Publication Data
US 2013/0068296 A1   Mar. 21, 2013

(30) Foreign Application Priority Data

May 19, 2010   (JP) .................................. 2010-115319
Oct. 14, 2010   (JP) .................................. 2010-231710

(51) Int. Cl.
*H01L 31/04*  (2014.01)
*C25B 9/00*  (2006.01)
(Continued)

(52) U.S. Cl.
CPC ............. *C25B 9/00* (2013.01); *C01B 13/0207* (2013.01); *C25B 1/00* (2013.01); *H01L 31/048* (2013.01);
(Continued)

(58) Field of Classification Search
CPC ...... C01B 13/0207; C01B 3/042; C25B 1/00; C25B 9/00; C25B 1/003; H01L 31/048; H01L 31/075; H02J 1/10; Y02E 60/366; Y02E 10/548; Y02E 60/364; Y02E 10/549

USPC .................................................. 136/256, 252
See application file for complete search history.

(56) References Cited

U.S. PATENT DOCUMENTS 4,341,607 A * 7/1982 Tison ............................. 205/343
4,352,722 A * 10/1982 Ohkawa ........................ 205/340
(Continued)

FOREIGN PATENT DOCUMENTS

CN     101565832 A     10/2009
JP     2000-192275     7/2000
(Continued)

OTHER PUBLICATIONS

International Search Report for PCT/JP2011/058811, mailed Jul. 12, 2011.

*Primary Examiner* — Golam Mowla
(74) *Attorney, Agent, or Firm* — Nixon & Vanderhye, P.C.

(57) ABSTRACT

The present invention provides a solar-cell-integrated gas production device that can generate a first gas and a second gas by utilizing an electromotive force of a solar cell, and that can supply power to an external circuit by utilizing the same solar cell. The solar-cell-integrated gas production device according to the present invention comprises: a photoelectric conversion part having a light acceptance surface and its back surface; a first electrolysis electrode provided on the back surface of the photoelectric conversion part so as to be capable of being immersed into an electrolytic solution; a second electrolysis electrode provided on the back surface of the photoelectric conversion part so as to be capable of being immersed into the electrolytic solution; and a changeover part, wherein the first electrolysis electrode and the second electrolysis electrode are provided to be capable of electrolyzing the electrolytic solution to generate a first gas and a second gas by utilizing an electromotive force generated by irradiating the photoelectric conversion part with light, and the changeover part makes a changeover between a circuit that outputs the electromotive force, generated by irradiating the photoelectric conversion part outputs the electromotive force, generated by irradiating the photoelectric conversion part with light, to the first electrolysis electrode and the second electrolysis electrode.

20 Claims, 9 Drawing Sheets

(51) Int. Cl.
*C01B 13/02* (2006.01)
*C25B 1/00* (2006.01)
*H01L 31/048* (2014.01)
*H01L 31/075* (2012.01)
*C01B 3/04* (2006.01)
*H02J 1/10* (2006.01)

(52) U.S. Cl.
CPC .............. *H01L 31/075* (2013.01); *C25B 1/003* (2013.01); *Y02E 60/366* (2013.01); *Y02E 10/548* (2013.01); *Y02E 60/364* (2013.01); *Y02E 10/549* (2013.01); *C01B 3/042* (2013.01); *H02J 1/10* (2013.01); *Y10S 136/293* (2013.01)

(56) References Cited

U.S. PATENT DOCUMENTS 7,510,640 B2 * 3/2009 Gibson et al. ................ 205/628
7,674,358 B2 * 3/2010 Gibson et al. .............. 204/228.1
2003/0006136 A1 1/2003 Hiki et al.
2005/0183962 A1 8/2005 Oakes
2007/0119718 A1 5/2007 Gibson et al.

FOREIGN PATENT DOCUMENTS

| | | | |
|---|---|---|---|
| JP | 2000-192275 | A | 7/2000 |
| JP | 2001-338672 | A | 12/2001 |
| JP | 2002-194579 | A | 7/2002 |
| JP | 2003-288955 | | 10/2003 |
| JP | 2004-197167 | A | 7/2004 |
| JP | 2005-168101 | A | 6/2005 |
| JP | 2007-524762 | | 8/2007 |
| JP | 2008-10593 | | 1/2008 |
| WO | 2005/081326 | A1 | 9/2005 |

* cited by examiner

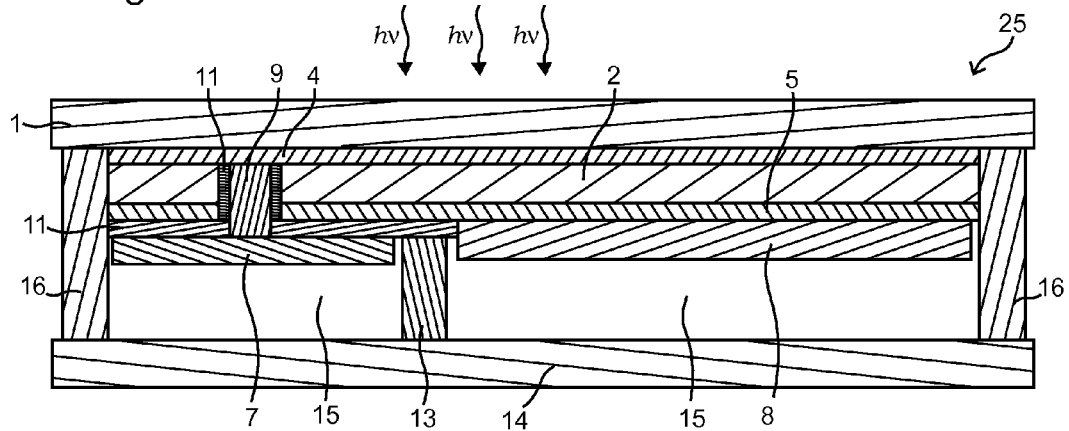
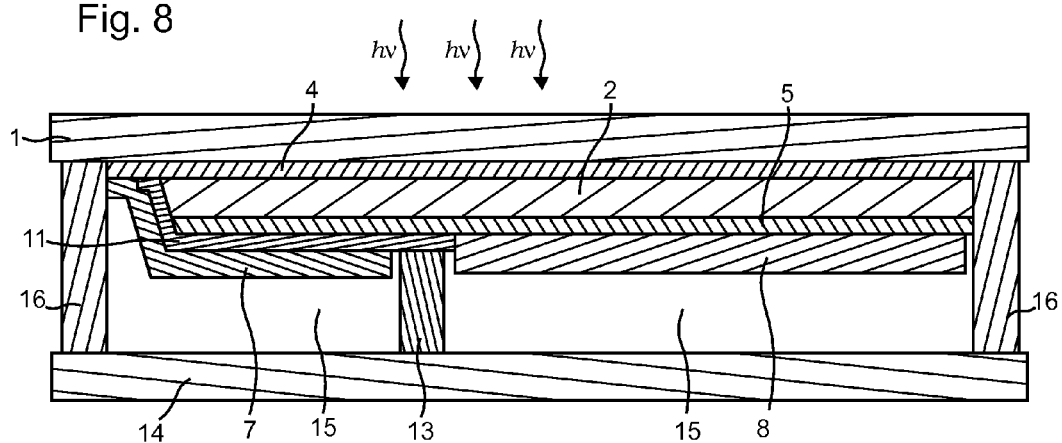
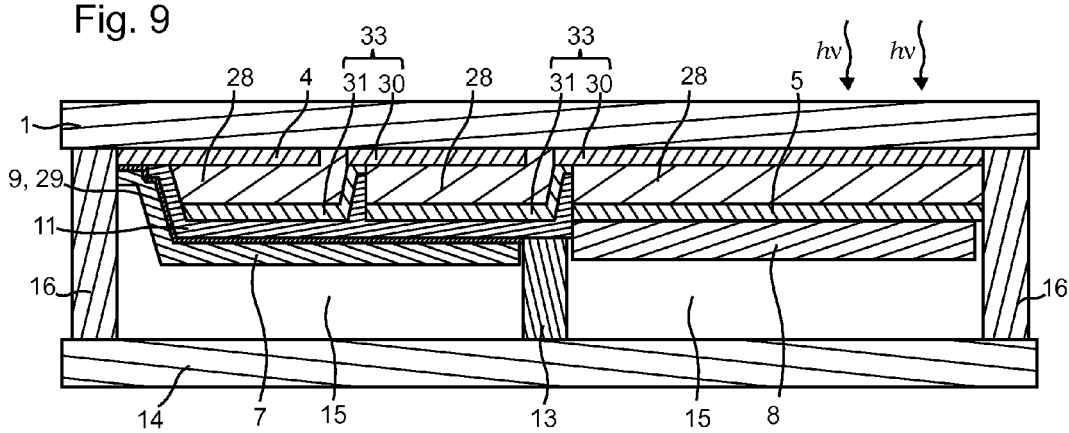

SOLAR-CELL-INTEGRATED GAS PRODUCTION DEVICE

This application is the U.S. national phase of International Application No. PCT/JP2011/058811, filed 7 Apr. 2011, which designated the U.S. and claims priority to Japan Application No. 2010-115319, filed 19 May 2010, and Japan Application No. 2010-231710, filed 14 Oct. 2010, the entire contents of each of which are hereby incorporated by reference.

TECHNICAL FIELD

The present invention relates to a solar-cell-integrated gas production device.

BACKGROUND ART

Recently, a solar cell that does not generate $CO_2$ for a power generation has been spread because of concern over global warming. However, the power generation using the solar cell has a problem that a power generation amount varies depending upon a period of time, and depending upon even a season. In order to solve this problem, there has been considered a power generation system that stores power, which is generated through the power generation by the solar cell, as hydrogen generated from an electrolysis of water, and eliminates the variation in the power generation amount by the power generation of a fuel cell employing the hydrogen gas as a fuel. Therefore, various techniques combining a solar cell and an electrolytic cell have been proposed.

For example, Patent document 1 describes a hydrogen production device that has a thin-film solar cell and an electrolytic catalyst layer, which are formed in parallel on a transparent electrode film formed on a substrate, and that can electrolyze an electrolytic solution by irradiating light to the thin-film solar cell.

Patent document 2 describes an electrolytic system that outputs an optimized electromotive force of a solar cell to an electrolytic cell so as to generate hydrogen gas and oxygen gas.

PRIOR ART DOCUMENTS

Patent Documents

Patent document 1: Japanese Unexamined Patent Publication No. 2003-288955
Patent document 2: Japanese Unexamined Patent Publication No. 2007-524762

SUMMARY OF THE INVENTION

Problems to be Solved by the Invention

The prior arts generate hydrogen gas by utilizing an electromotive force of the solar cell, but they cannot supply power to an external circuit by utilizing the same solar cell.

The present invention was made in view of the above circumstances, and it is an object of the present invention to provide a solar-cell-integrated gas production device that can generate a first gas and a second gas by utilizing an electromotive force of a solar cell, and that can supply power to an external circuit by utilizing the same solar cell.

Means for Solving the Problems

The present invention provides a solar-cell-integrated gas production device comprising: a photoelectric conversion part having a light acceptance surface and its back surface; a first electrolysis electrode provided on the back surface of the photoelectric conversion part so as to be capable of being immersed into an electrolytic solution; a second electrolysis electrode provided on the back surface of the photoelectric conversion part so as to be capable of being immersed into the electrolytic solution; and a changeover part, wherein the first electrolysis electrode and the second electrolysis electrode are provided to be capable of electrolyzing the electrolytic solution to generate a first gas and a second gas by utilizing an electromotive force generated by irradiating the photoelectric conversion part with light, and the changeover part makes a changeover between a circuit that outputs the electromotive force, generated by irradiating the photoelectric conversion part with light, to a first external circuit, and a circuit that outputs the electromotive force, generated by irradiating the photoelectric conversion part with light, to the first electrolysis electrode and the second electrolysis electrode.

Effects of the Invention

According to the present invention, the electromotive force generated by irradiating the photoelectric conversion part with light can be outputted to the first electrolysis electrode and the second electrolysis electrode, whereby the first gas and the second gas can be produced from the electrolytic solution on the first electrolysis electrode and the second electrolysis electrode, which can be immersed into the electrolytic solution.

According to the present invention, the electromotive force generated by irradiating the photoelectric conversion part with light can be outputted to the first external circuit via the changeover part, whereby the power can be supplied to the first external circuit.

According to the present invention, the changeover part makes a changeover between the circuit that outputs the electromotive force, generated by irradiating the photoelectric conversion part with light, to the first external circuit, and the circuit that outputs the electromotive force, generated by irradiating the photoelectric conversion part with light, to the first electrolysis electrode and the second electrolysis electrode, whereby the power supply and the production of the first gas and the second gas can be switched according to an amount of solar irradiation irradiated to the photoelectric conversion part or a power demand of a facility provided with the device of the present invention. Thus, the electromotive force generated by irradiating the photoelectric conversion part with light can efficiently be utilized.

According to the present invention, since the first electrolysis electrode and the second electrolysis electrode are provided on the back surface of the photoelectric conversion part, the light can enter the light acceptance surface of the photoelectric conversion part without passing through the electrolytic solution, so that the incident light can be prevented from being absorbed and the incident light can be prevented from being scattered by the electrolytic solution. Thus, the incident light amount entering the photoelectric conversion part can be large, and the light use efficiency can be high.

In addition, according to the present invention, since the first electrolysis electrode and the second electrolysis electrode are provided on the back surface of the photoelectric conversion part, the light entering the light acceptance surface is not absorbed or scattered by the first electrolysis electrode and the second electrolysis electrode, as well as by the first gas and the second gas generated from those electrodes, respectively. Thus, the incident light amount entering the photoelectric conversion part can be large, and the light use efficiency can be high.

According to the present invention, since the first electrolysis electrode and the second electrolysis electrode are provided on the back surface of the photoelectric conversion part, the first gas and the second gas can be produced on the back surface of the photoelectric conversion part. Therefore, a wiring resistance between the photoelectric conversion part and the electrolysis electrodes can be reduced, resulting in that the first gas and the second gas can efficiently be produced.

According to the present invention, since the solar cell and the gas production device are formed integral, the device can be more compact, and the installation area can be reduced. A shared part can be utilized for both the solar cell and the gas production device, so that the production cost can be decreased.

BRIEF DESCRIPTION OF THE DRAWINGS

FIG. 7 is a schematic cross-sectional view of the solar-cell-integrated gas production device according to an embodiment of the present invention.

FIG. 8 is a schematic cross-sectional view of the solar-cell-integrated gas production device according to an embodiment of the present invention.

FIG. 9 is a schematic cross-sectional view of the solar-cell-integrated gas production device according to an embodiment of the present invention.

MODES FOR CARRYING OUT THE INVENTION

Figure 1:
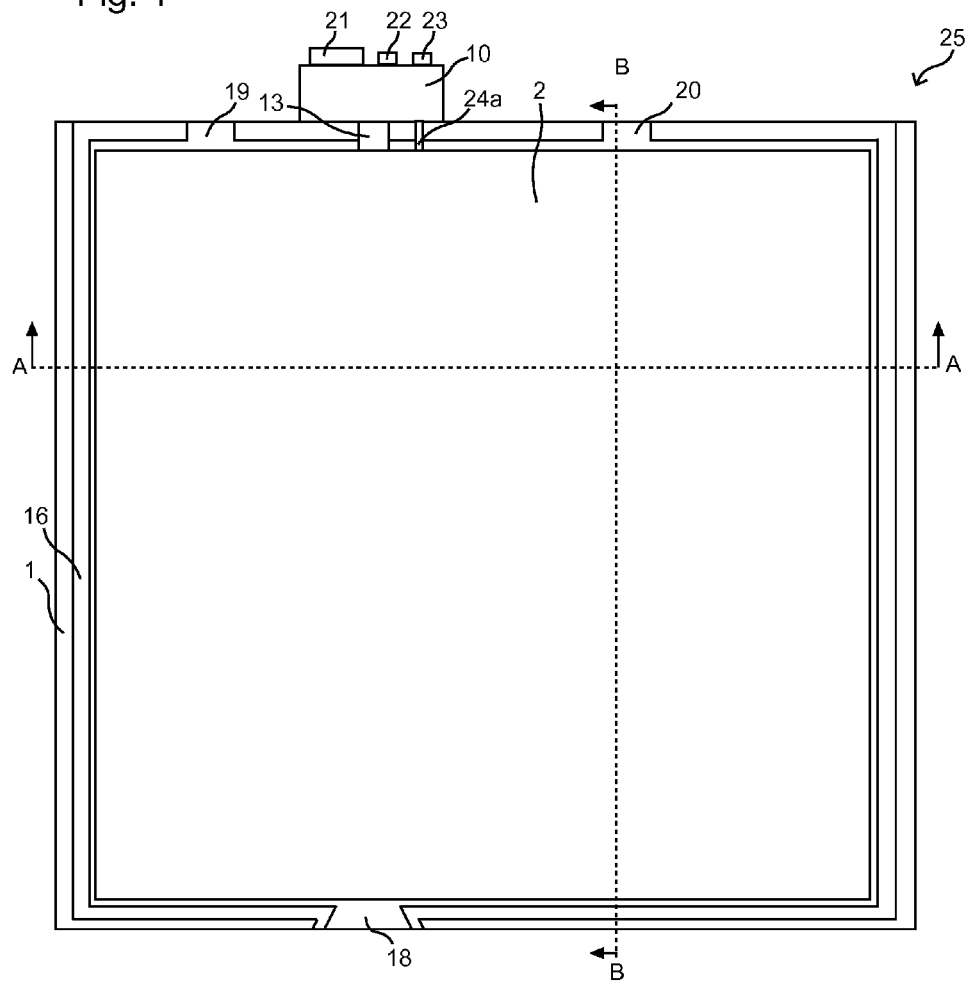
FIG. 1 is a schematic plan view of a solar-cell-integrated gas production device according to an embodiment of the present invention.

A solar-cell-integrated gas production device according to the present invention comprises: a photoelectric conversion part having a light acceptance surface and its back surface; a first electrolysis electrode provided on the back surface of the photoelectric conversion part so as to be capable of being immersed into an electrolytic solution; a second electrolysis electrode provided on the back surface of the photoelectric conversion part so as to be capable of being immersed into the electrolytic solution; and a changeover part, wherein the first electrolysis electrode and the second electrolysis electrode are provided to be capable of electrolyzing the electrolytic solution to generate a first gas and a second gas by utilizing an electromotive force generated by irradiating the photoelectric conversion part with light, and the changeover part makes a changeover between a circuit that outputs the electromotive force, generated by irradiating the photoelectric conversion part with light, to a first external circuit, and a circuit that outputs the electromotive force, generated by irradiating the photoelectric conversion part with light, to the first electrolysis electrode and the second electrolysis electrode.

The solar-cell-integrated gas production device has a function of a solar cell and a function of a gas production device.

In the solar-cell-integrated gas production device according to the present invention, it is preferable that one of the first gas and the second gas is hydrogen gas, and the other is oxygen gas.

According to the above configuration, hydrogen gas and oxygen gas can be produced from the electrolytic solution on the first electrolysis electrode and the second electrolysis electrode.

It is also preferable that the solar-cell-integrated gas production device according to the present invention includes an insulation part provided on the back surface of the photoelectric conversion part, and the first electrolysis electrode and the second electrolysis electrode are provided on the insulation part and are electrically connected to the changeover part respectively.

According to the above configuration, the electromotive force generated by irradiating the photoelectric conversion part with light can be outputted to the first external circuit through the changeover part, and the electromotive force generated by irradiating the photoelectric conversion part with light can be outputted to the first electrolysis electrode or the second electrolysis electrode. This configuration can also prevent a leak current from flowing, when the electromotive force is outputted to the first external circuit or the first and second electrolysis electrodes.

It is preferable that the solar-cell-integrated gas production device according to the present invention includes an insulation part provided on the back surface of the photoelectric conversion part, wherein the second electrolysis electrode is provided on the insulation part and is electrically connected to the changeover part, and the first electrolysis electrode is provided on the back surface of the photoelectric conversion part and is electrically connected to the back surface of the photoelectric conversion part.

According to the above configuration, the electromotive force generated by irradiating the photoelectric conversion part with light can be outputted to the first external circuit through the changeover part, and the electromotive force generated by irradiating the photoelectric conversion part with light can be outputted to the first electrolysis electrode or the second electrolysis electrode. This configuration can also prevent a leak current from flowing, when the electromotive force is outputted to the first external circuit or the first and second electrolysis electrodes.

It is preferable that the solar-cell-integrated gas production device according to the present invention includes a first electrode formed on the light acceptance surface of the photoelectric conversion part, and an insulation part provided on the back surface of the photoelectric conversion part, wherein the second electrolysis electrode is provided on the insulation part and is electrically connected to the first electrode, and the first electrolysis electrode is provided on the insulation part and is electrically connected to the changeover part.

According to the above configuration, the electromotive force generated by irradiating the photoelectric conversion part with light can be outputted to the first external circuit through the changeover part, and the electromotive force generated by irradiating the photoelectric conversion part with light can be outputted to the first electrolysis electrode or the second electrolysis electrode. This configuration can also prevent a leak current from flowing, when the electromotive force is outputted to the first external circuit or the first and second electrolysis electrodes.

It is preferable that the solar-cell-integrated gas production device according to the present invention includes a first electrode formed on the light acceptance surface of the photoelectric conversion part, and an insulation part provided on the back surface of the photoelectric conversion part, wherein the second electrolysis electrode is provided on the insulation part and is electrically connected to the first electrode, and the first electrolysis electrode is provided on the back surface of the photoelectric conversion part and is electrically connected to the back surface of the photoelectric conversion part.

According to the above configuration, the electromotive force generated by irradiating the photoelectric conversion part with light can be outputted to the first electrolysis electrode or the second electrolysis electrode. When the electromotive force generated by irradiating the photoelectric conversion part with light does not reach an electrolysis voltage of the electrolytic solution, the electromotive force generated by irradiating the photoelectric conversion part with light can be outputted to the first external circuit through the changeover part.

It is preferable that the solar-cell-integrated gas production device according to the present invention further includes a first conductive part that electrically connects the second electrolysis electrode and the first electrode.

According to the above configuration, the electromotive force generated by irradiating the photoelectric conversion part with light can efficiently be outputted to the second electrolysis electrode.

In the solar-cell-integrated gas production device according to the present invention, the first conductive part is preferably provided on a contact hole that penetrates the photoelectric conversion part.

According to the above configuration, the second electrolysis electrode and the first electrode can electrically be connected, whereby the potential of the second electrolysis electrode and the potential of the first electrode can be almost the same.

In the solar-cell-integrated gas production device according to the present invention, it is preferable that the insulation part is provided to cover the side face of the photoelectric conversion part, and the first conductive part is provided on a portion that is a part of the insulation part and covers the side face of the photoelectric conversion part.

According to the above configuration, the electromotive force generated by irradiating the photoelectric conversion part with light can efficiently be outputted to the second electrolysis electrode.

In the solar-cell-integrated gas production device according to the present invention, it is preferable that the insulation part is provided to cover the side face of the photoelectric conversion part, and the second electrolysis electrode is provided on a portion that is a part of the insulation part and covers the side face of the photoelectric conversion part, and is brought into contact with the first electrode.

According to the above configuration, the electromotive force generated by irradiating the photoelectric conversion part with light can efficiently be outputted to the second electrolysis electrode.

It is preferable that the solar-cell-integrated gas production device according to the present invention further includes a first electrode provided on the light acceptance surface of the photoelectric conversion part, and a second electrode provided on the back surface of the photoelectric conversion part, wherein the first electrode and the second electrode are electrically connected to the changeover part.

According to the above configuration, the electromotive force generated by irradiating the photoelectric conversion part with light can be outputted to the first external circuit or the first and second electrolysis electrodes.

In the solar-cell-integrated gas production device according to the present invention, it is preferable that the photoelectric conversion part generates a potential difference between first and second regions on the back surface of the photoelectric conversion part when being irradiated with light, wherein the first region is formed to be electrically connected to the first electrolysis electrode, while the second region is formed to be electrically connected to the second electrolysis electrode.

According to the above configuration, the first and second regions and the first and second electrolysis electrodes can electrically be connected with ease, whereby the production cost can be reduced.

In the solar-cell-integrated gas production device according to the present invention, it is preferable that the photoelectric conversion part is formed of at least one semiconductor material having an n-type semiconductor part and a p-type semiconductor part, wherein one of the first and second regions is a part of the n-type semiconductor part, while the other is a part of the p-type semiconductor part.

According to the above configuration, the potential difference can be generated between the first and the second regions on the back surface of the photoelectric conversion part.

It is preferable that the solar-cell-integrated gas production device according to the present invention further includes an insulation part provided on a portion between the back surface of the photoelectric conversion part and the first electrolysis electrode and a portion between the back surface and the second electrolysis electrode, wherein the first electrolysis electrode and the second electrolysis electrode are electrically connected to the n-type semiconductor part or the p-type semiconductor part through the first and second regions where the insulation part is not provided.

According to this configuration, electrons and holes, which are generated by irradiating the photoelectric conversion part with light, can efficiently be separated from each other, whereby the photoelectric conversion efficiency can be more increased.

In the solar-cell-integrated gas production device according to the present invention, it is preferable that the first region and the second region are electrically connected to the changeover part respectively.

According to this configuration, the electromotive force generated between the first and second regions by irradiating the photoelectric conversion part with light can be outputted to the first external circuit.

It is preferable that the solar-cell-integrated gas production device according to the present invention further includes a second conductive part provided between the insulation part and the first electrolysis electrode or between the insulation part and the second electrolysis electrode.

According to this configuration, the internal resistance caused on the first electrolysis electrode or the second electrolysis electrode can be reduced more.

It is preferable that the solar-cell-integrated gas production device according to the present invention further includes a light-transmitting substrate, wherein the photoelectric conversion part is provided on the light-transmitting substrate such that the light acceptance surface is located on the side of the light-transmitting substrate.

According to this configuration, the photoelectric conversion part can be formed on the light-transmitting substrate, whereby the photoelectric conversion part can more easily be formed.

It is preferable that the solar-cell-integrated gas production device according to the present invention further includes a back substrate provided on the side of the back surface of the photoelectric conversion part, wherein the second electrolysis electrode is provided on the back substrate and is electrically connected to the changeover part, and the first electrolysis electrode is provided on the back surface of the photoelectric conversion part and is electrically connected to the back surface of the photoelectric conversion part.

According to this configuration, an area where the first electrolysis electrode and the second electrolysis electrode are to be formed can be increased, so that the surface of the electrolysis electrode and the surface of the second electrolysis electrode on which the electrolysis reaction of the electrolytic solution progresses can be increased.

It is preferable that the solar-cell-integrated gas production device according to the present invention further includes an electrolytic solution chamber that can store the electrolytic solution into which the first electrolysis electrode or the second electrolysis electrode can be immersed.

According to this configuration, the first electrolysis electrode and the second electrolysis electrode can be immersed into the electrolytic solution.

It is preferable that the solar-cell-integrated gas production device according to the present invention further includes a back substrate, wherein the electrolytic solution chamber is provided between the back surface of the photoelectric conversion part and the back substrate.

According to this configuration, the electrolytic solution chamber that can store the electrolytic solution into which the first electrolysis electrode or the second electrolysis electrode can be immersed can easily be provided.

It is preferable that the solar-cell-integrated gas production device according to the present invention further includes a partition wall that separates an electrolytic solution chamber capable of storing the electrolytic solution into which the first electrolysis electrode is immersed and an electrolytic solution chamber capable of storing the electrolytic solution into which the second electrolysis electrode is immersed.

According to this configuration, the first gas and the second gas, which are generated respectively from the first electrolysis electrode and the second electrolysis electrode, can be separated, so that the first gas and the second gas can more efficiently be collected.

In the solar-cell-integrated gas production device according to the present invention, it is preferable that the partition wall contains an ion exchanger.

According to the above configuration, the partition wall can equalize an ion concentration that became unbalanced between the electrolytic solution introduced into the electrolytic solution chamber above the first electrolysis electrode and the electrolytic solution introduced into the electrolytic solution chamber above the second electrolysis electrode, whereby the first gas and the second gas can stably be generated.

In the solar-cell-integrated gas production device according to the present invention, it is preferable that the photoelectric conversion part has a photoelectric conversion layer formed of a p-type semiconductor layer, an i-type semiconductor layer, and an n-type semiconductor layer.

According to the above configuration, the photoelectric conversion part can have a pin structure, so that the photoelectric conversion can be efficiently performed. In addition, the more electromotive force can be generated in the photoelectric conversion part, so that the electrolytic solution can be more efficiently electrolyzed.

In the solar-cell-integrated gas production device according to the present invention, it is preferable that the photoelectric conversion part includes a plurality of photoelectric conversion layers connected in series, wherein the plurality of photoelectric conversion layers supply the electromotive force generated by the light incidence to the first electrolysis electrode and the second electrolysis electrode.

According to the above configuration, the potential difference caused by irradiating the photoelectric conversion part with light can be increased more, so that the first gas and the second gas can efficiently be generated.

In the solar-cell-integrated gas production device according to the present invention, it is preferable that each of the photoelectric conversion layers is connected in series with a third conductive part.

According to the above configuration, the photoelectric conversion layers arranged in parallel can be connected in series.

In the solar-cell-integrated gas production device according to the present invention, it is preferable that the third conductive part includes a light-transmitting electrode provided on the light acceptance surface of the photoelectric conversion layer and a back electrode provided on the back surface of the photoelectric conversion layer.

According to the above configuration, the photoelectric conversion layers arranged in parallel can be connected in series.

In the solar-cell-integrated gas production device according to the present invention, it is preferable that one of the first electrolysis electrode and the second electrolysis electrode is a hydrogen generation part to generate $H_2$ from the electrolytic solution, and the other is an oxygen generation part to generate $O_2$ from the electrolytic solution, wherein the hydrogen generation part and the oxygen generation part respectively contain a catalyst of a reaction to generate $H_2$ from the electrolytic solution and a catalyst of a reaction to generate $O_2$ from the electrolytic solution.

According to the above configuration, hydrogen gas serving as a fuel of a fuel cell can be produced by the solar-cell-integrated gas production device according to the present invention. Since the respective catalysts are contained, the rate of the progression of the electrolysis reaction of the electrolytic solution can be increased. In addition, the produced hydrogen gas can be utilized not only as the fuel of the fuel cell but also as a heat source.

In the solar-cell-integrated gas production device according to the present invention, it is preferable that at least one of the hydrogen generation part and the oxygen generation part is formed of a catalyst-supporting porous conductor.

According to the configuration described above, the catalytic surface area of at least one of the hydrogen generation part and the oxygen generation part can be increased, so that oxygen gas or hydrogen gas can more efficiently be generated. Since the porous conductor is used, the change in the potential, which is caused because a current flows between the photoelectric conversion part and the catalyst, can be prevented, whereby oxygen gas or hydrogen gas can more efficiently be generated.

In the solar-cell-integrated gas production device according to the present invention, it is preferable that the changeover part can electrically be connected to a second external circuit, and can make a changeover to a circuit that outputs the electromotive force inputted from the second external circuit to the first electrolysis electrode and the second electrolysis electrode to generate the first gas and the second gas respectively from the electrolytic solution.

According to the above configuration, when the solar-cell-integrated gas production device according to the present invention and a device that generates an electromotive force, such as a solar cell panel, are installed side by side, the first gas and the second gas can be produced by utilizing the electromotive force generated in the device.

It is preferable that the solar-cell-integrated gas production device according to the present invention further includes a changeover selecting part that selects the circuit to be changed by the changeover part, and outputs the selected result to the changeover part, wherein the changeover part makes a changeover based upon the inputted result selected by the changeover selecting unit.

According to the above configuration, the power supply and the production of the first gas the second gas can be switched according to the condition of the device, such as the amount of the solar irradiation irradiated to the photoelectric conversion part, and a demand condition, such as a power demand, of the facility provided with the device of the present invention.

In the solar-cell-integrated gas production device according to the present invention, it is preferable that the changeover selecting part selects the circuit to be changed by the changeover part based upon at least one of a predicted amount of solar radiation irradiated to the device, a rainfall probability, time and date, ambient temperature, and a power demand estimate.

According to the above configuration, the power supply to the first external circuit by the solar-cell-integrated gas production device according to the present invention and the production of the first gas and the second gas can be switched based upon at least one of a predicted amount of solar radiation irradiated to the device, a rainfall probability, time and date, ambient temperature, and a power demand estimate. Accordingly, the electromotive force generated in the photoelectric conversion part can effectively be utilized with zero waste.

Hereinafter, an embodiment of the present invention will be described with reference to the drawings. The configurations shown in the drawings and in the following description are just examples, and the scope of the present invention is not limited to those shown in the drawings and in the following description.

Configuration of Solar-Cell-Integrated Gas Production Device

A solar-cell-integrated gas production device 25 according to the present embodiment comprises a photoelectric conversion part 2 having a light acceptance surface and its back surface; a first electrolysis electrode 8 formed on the back surface of the photoelectric conversion part 2 so as to be immersible into an electrolytic solution; a second electrolysis electrode 7 formed on the back surface of the photoelectric conversion part 2 so as to be immersible into an electrolytic solution; and a changeover part 10, wherein the first electrolysis electrode 8 and the second electrolysis electrode 7 are provided to be capable of generating a first gas and a second gas through an electrolysis of the electrolytic solution by utilizing an electromotive force generated by the photoelectric conversion part 2 irradiated with light, and the changeover part 10 changes a circuit that outputs the electromotive force, generated by irradiating the photoelectric conversion part 2 with light, to a first external circuit, and a circuit that outputs the electromotive force, generated by irradiating the photoelectric conversion part 2 with light, to the first electrolysis circuit 8 and the second electrolysis circuit 7.

The solar-cell-integrated gas production device 25 may also have a light-transmitting substrate 1, a second electrode 5, a first conductive part 9, an insulating part 11, a partition wall 13, a back substrate 14, an electrolytic solution chamber 15, a seal material 16, and a changeover selecting part 21.

Hereinafter, the solar-cell-integrated gas production device 25 according to the present embodiment will be described.

Figure 2:
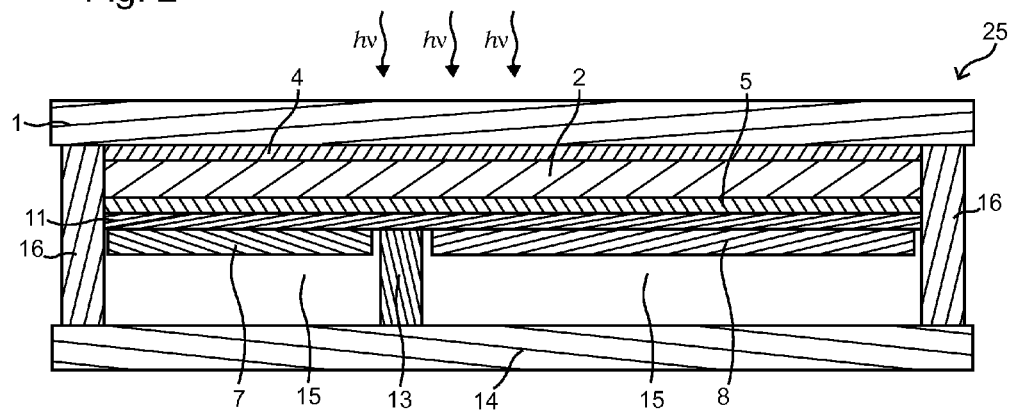
FIG. 2 is a schematic cross-sectional view of the solar-cell-integrated gas production device taken along a dotted line A-A in FIG. 1.
Figure 3:
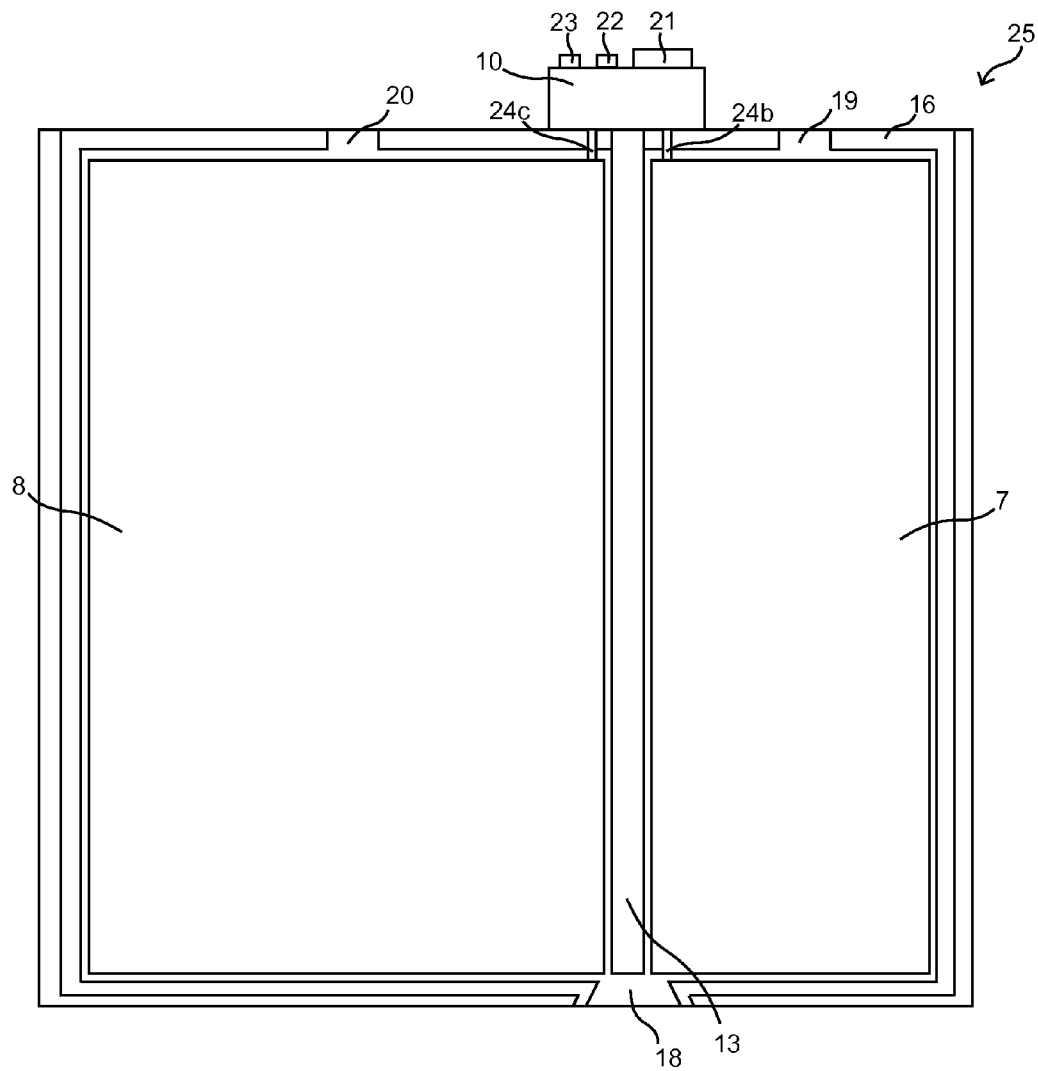
FIG. 3 is a schematic back surface view of the solar-cell-integrated gas production device according to the embodiment of the present invention.
Figure 4:
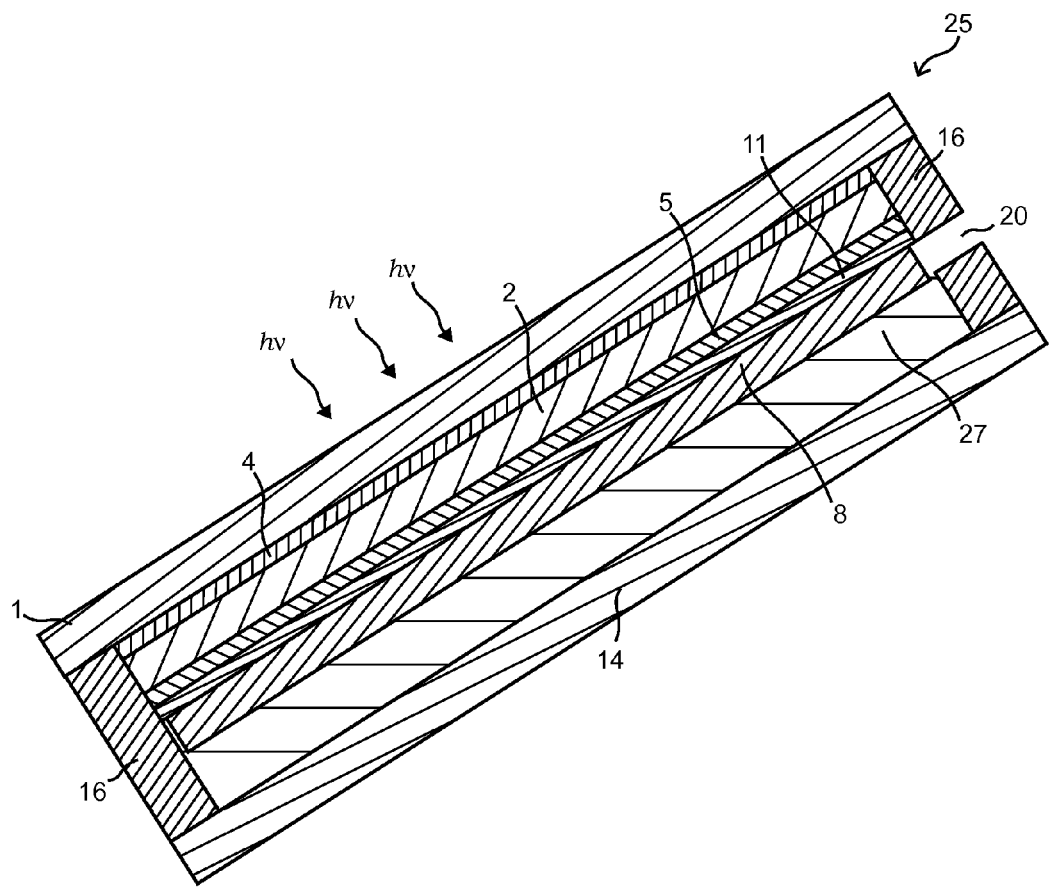
FIG. 4 is a schematic cross-sectional view of the solar-cell-integrated gas production device taken along a dotted line B-B in FIG. 1.

The solar-cell-integrated gas production device 25 according to the present embodiment may have a cross-section illustrated in FIG. 2, and may have a cross-section illustrated in FIG. 5, 6, 7, 8, 9, 10, 11, or 12. FIGS. 5 to 8 correspond to cross-sectional views taken along a dotted line A-A in FIG. 1. FIGS. 9 to 12 correspond to cross-sectional views taken along the dotted line A-A in FIG. 1, although the position of the partition wall 13 or other members is different.

1. Light-Transmitting Substrate

The light-transmitting substrate 1 is not particularly limited, so long as it is a substrate having light translucency. Materials for the light-transmitting substrate 1 include transparent rigid materials such as soda glass, quartz glass, Pyrex (registered trademark), and synthetic quartz plate, a transparent resin plate, and a film material. A glass substrate is preferably used because it is chemically and physically stable.

The surface of the light-transmitting substrate 1 on the side of the photoelectric conversion part 2 may have a fine concavo-convex structure so that the incident light can be effectively irregularly reflected on the surface of the photoelectric conversion part 2. This fine concavo-convex structure can be formed by a well-known method such as a reactive ion etching (RIE) process or a blast process.

2. First Electrode

Figure 6:
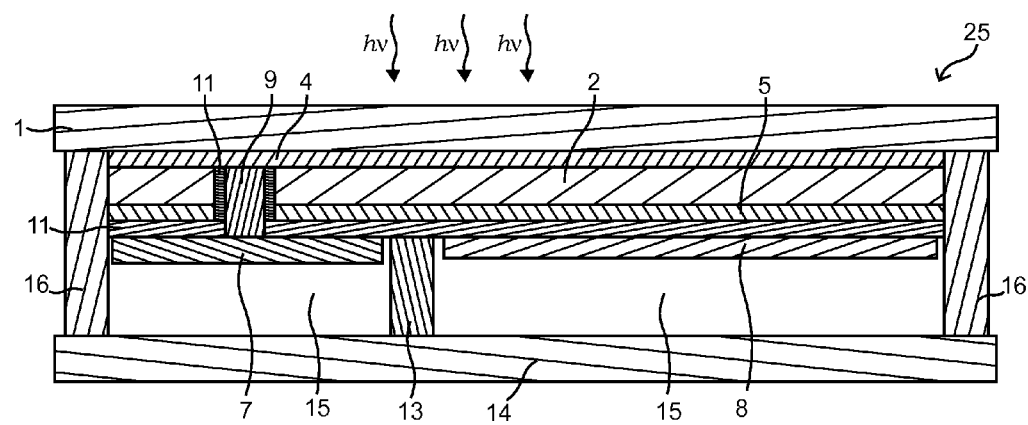
FIG. 6 is a schematic cross-sectional view of the solar-cell-integrated gas production device according to an embodiment of the present invention.

The first electrode 4 can be provided on the light-transmitting substrate 1, and can be provided so as to be in contact with the light acceptance surface of the photoelectric conversion part 2. In addition, the first electrode 4 can electrically be connected to the changeover part 10. Alternatively, the first electrode 4 may electrically be connected to the second electrolysis electrode 7 through the first conductive part 9 as illustrated in FIGS. 6, 7, and 9, or may electrically be connected to the second electrolysis electrode 7 as illustrated in FIG. 8. In addition, the first electrode 4 may have translucency.

Figure 11:
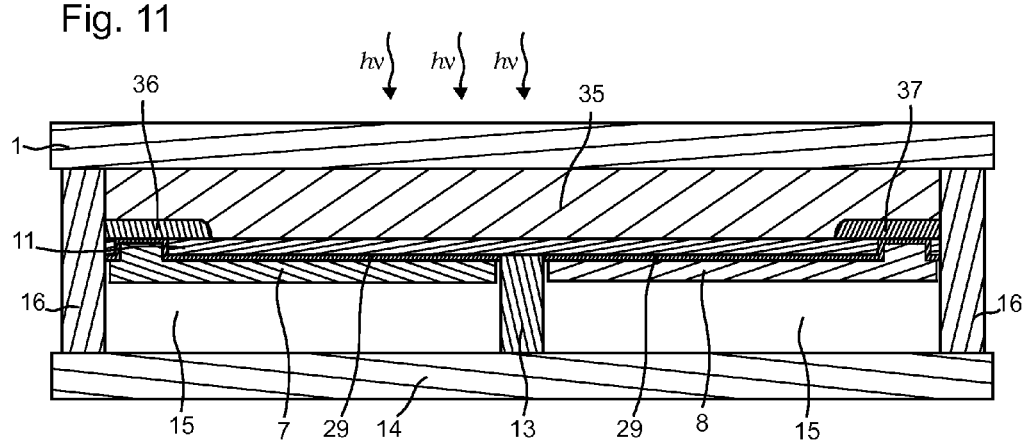
FIG. 11 is a schematic cross-sectional view of the solar-cell-integrated gas production device according to an embodiment of the present invention.
Figure 12:
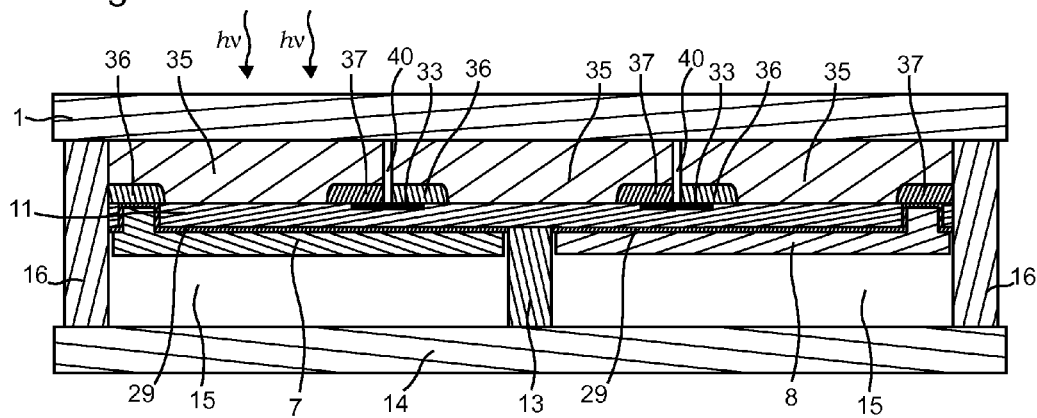
FIG. 12 is a schematic cross-sectional view of the solar-cell-integrated gas production device according to an embodiment of the present invention.

When the solar-cell-integrated gas production device 25 according to the present embodiment has the cross-section illustrated in FIG. 11 or FIG. 12, the first electrode 4 can be eliminated.

By providing the first electrode 4, a larger current flows between the light acceptance surface of the photoelectric conversion part 2 and the changeover part 10. In a case where the first electrode 4 is electrically connected to the second electrolysis electrode 7 through the first conductive part 9 as illustrated in FIGS. 6, 7, and 9, the electromotive force generated by the photoelectric conversion part 2 can efficiently be outputted to the first electrolysis electrode 8 and the second electrolysis electrode 7.

The first electrode 4 may be formed of a transparent conductive film made of ITO or $SnO_2$, or may be formed of a finger electrode made of a metal such as Ag or Au. The first electrode 4 may also be made of an electrode formed by combining the transparent conductive film and the metallic finger electrode.

Hereinafter, a description will be made of the case where the first electrode 4 is formed of the transparent conductive film.

The transparent conductive film is used to easily connect the light acceptance surface of the photoelectric conversion part 2 to the changeover part 10.

Any material used as a transparent electrode in general can be used. More specifically, the transparent electrode may be made of In—Zn—O (IZO), In—Sn—O (ITO), ZnO—Al, Zn—Sn—O, or $SnO_2$. In addition, the transparent conductive film preferably has a sunlight transmittance of 85% or more, more preferably 90% or more, and most preferably 92% or more. In this case, the photoelectric conversion part 2 can efficiently absorb light.

The transparent conductive film may be formed in a well-known method such as the sputtering method, the vacuum deposition method, the sol-gel method, the cluster beam deposition method, or the PLD (Pulse Laser Deposition) method.

3. Photoelectric Conversion Part

The photoelectric conversion part 2 can be provided on the light-transmitting substrate 1, and causes a potential difference when irradiated with light. The photoelectric conversion part 2 may be the one generating the potential difference between the light acceptance surface and the back surface as illustrated in FIGS. 2, and 5 to 10, or may be the one generating the potential difference between a first region and a second region on the back surface of the photoelectric conversion part 2 as illustrated in FIGS. 11 and 12. The photoelectric conversion part 2 may be a photoelectric conversion part using a silicon base semiconductor, a photoelectric conversion part using a compound semiconductor, a photoelectric conversion part using a dye sensitizer, or a photoelectric conversion part using an organic thin film.

In case where the light acceptance surface and the back surface of the photoelectric conversion part 2 are electrically connected to the first electrolysis electrode 8 and the second electrolysis electrode 7 through the changeover part 10, the photoelectric conversion part 2 has to be made of a material which generates the electromotive force required for generating the first gas and the second gas in the first electrolysis electrode 8 and the second electrolysis electrode 7, respectively, by receiving light.

When one of the first gas and the second gas is the hydrogen gas, and the other is the oxygen gas, the photoelectric conversion part 2 has to generate the electromotive force required for generating the hydrogen gas and the oxygen gas in the first electrolysis electrode 8 and the second electrolysis electrode 7, respectively, through the decomposition of water contained in the electrolytic solution. A potential difference between the first electrolysis electrode 8 and the second electrolysis electrode 7 needs to be more than a theoretic voltage (1.23 V) required for water decomposition, so that it is necessary to generate the sufficiently large potential difference in the photoelectric conversion part 2. Therefore, the photoelectric conversion part 2 is preferably provided such that the part (photoelectric conversion layer 28) to generate the electromotive force is formed of two or more junctions such as pn junctions connected in series. A method of connecting the photoelectric conversion layers 28 in series is not particularly limited. For example, the photoelectric conversion layers 28 may be stacked and connected in series. Alternatively, the photoelectric conversion layers 28 that are arranged side by side may be connected in series with a third conductive part 33 as illustrated in FIGS. 9 and 12. The third conductive part 33 may include a light-transmitting electrode 30 and a back electrode 31 as illustrated in FIG. 9.

Materials for the photoelectric conversion include materials provided based on a silicon base semiconductor, a compound semiconductor, and an organic material, and any photoelectric conversion material can be used. In addition, in order to increase the electromotive force, the above photoelectric conversion materials may be laminated. When photoelectric conversion materials are laminated, a multi-junction structure may be made of the same material. In a case where the plurality of photoelectric conversion layers having different optical bandgaps are laminated to complement low-sensitive wavelength regions of the photoelectric conversion layers to each other, the incident light can be efficiently absorbed over a large wavelength region.

In addition, in order to improve series connection characteristics among the photoelectric conversion layers, and in order to match photocurrents generated in the photoelectric conversion part 2, a conductor such as a transparent conductive film may be interposed between the layers. Thus, the photoelectric conversion part 2 can be prevented from deteriorating.

Hereinafter, examples of the photoelectric conversion part 2 will be described more specifically. It is noted that the photoelectric conversion part 2 may be provided by combining these examples.

3-1. Photoelectric Conversion Part Using Silicon Base Semiconductor

The photoelectric conversion part 2 using the silicon base semiconductor may be of a monocrystalline type, a polycrystalline type, an amorphous type, a spherical silicon type, or a combination of those. A pn junction between a p-type semiconductor and an n-type semiconductor can be provided in any one of these types. Alternatively, a pin junction in which an i-type semiconductor is provided between the p-type semiconductor and the n-type semiconductor can be provided. Further alternatively, a plurality of pn junctions, a plurality of pin junctions, or the pn junction and pin junction may be provided.

The silicon base semiconductor is the semiconductor containing silicon series such as silicon, silicon carbide, or silicon germanium. In addition, it may include the one in which an n-type impurity or a p-type impurity is added to silicon, and may include a crystalline, amorphous, or microcrystalline semiconductor.

Alternatively, the photoelectric conversion part 2 using the silicon base semiconductor may be a thin-film or thick-film photoelectric conversion layer formed on the substrate 1, the one in which the pn junction or the pin junction is formed on a wafer such as a silicon wafer, or the one in which the thin-film photoelectric conversion layer is formed on a wafer having the pn junction or the pin junction.

An example of a method for forming the photoelectric conversion part 2 using the silicon base semiconductor is shown below.

A first conductivity type semiconductor layer is formed on the first electrode 4 laminated on the light-transmitting substrate 1 by a method such as a plasma CVD method. This first conductivity type semiconductor layer is a p+-type or n+-type amorphous Si thin film, or a polycrystalline or microcrystalline Si thin film doped such that an impurity atom concentration is $1 \times 10^{18}$ to $5 \times 10^{21}/cm^3$. The material for the first conductivity type semiconductor layer is not limited to Si, and a compound such as SiC, SiGe, or $SiO_{1-X}$ may be used.

A polycrystalline or microcrystalline Si thin film is formed as a crystalline Si base photoactive layer, on the first conductivity type semiconductor layer formed as described above by a method such as the plasma CVD method. In this case, the conductivity type is the first conductivity type whose doping concentration is lower than that of the first conductivity type semiconductor layer, or an i type. The material for the crystalline Si base photoactive layer is not limited to Si, and a compound such as SiC, SiGe, or $SiO_{1-X}$ may be used.

Then, in order to form a semiconductor junction on the crystalline Si base photoactive layer, a second conductivity type semiconductor layer whose conductivity type is opposite to that of the first conductivity type semiconductor layer is formed by a method such as the plasma CVD method. This second conductivity type semiconductor layer is an n+-type or p+-type amorphous Si thin film, or a polycrystalline or microcrystalline Si thin film doped with an impurity atom with $1 \times 10^{18}$ to $5 \times 10^{21}/cm^3$. The material for the second conductivity type semiconductor layer is not limited to Si, and a compound such as SiC, SiGe, or $SiO_{1-X}$ may be used. In addition, in order to further improve the junction characteristics, a substantially i-type amorphous Si base thin film can be inserted between the crystalline Si base photoactive layer and the second conductivity type semiconductor layer. Thus, it is possible to laminate the photoelectric conversion layer which is closest to the light acceptance surface.

Then, a second photoelectric conversion layer is formed. The second photoelectric conversion layer is formed of a first conductivity type semiconductor layer, a crystalline Si base photoactive layer, and a second conductivity type semiconductor layer, and they are formed in the same manners correspondingly as the first conductivity type semiconductor layer, the crystalline Si base photoactive layer, and the second conductivity type semiconductor layer in the first photoelectric conversion layer. When the potential required for water decomposition cannot be sufficiently obtained with the two-layer tandem, it is preferable to provide three-layer or more laminated structure. Here, it is to be noted that a crystallization volume fraction of the crystalline Si base photoactive layer in the second photoelectric active layer is preferably higher than that of the crystalline Si base photoactive layer in the first layer. Similarly, when the three or more layers are laminated, its crystallization volume fraction is preferably higher than that of the lower layer. This is because absorption is high in a long-wavelength region, and spectral sensitivity is shifted to the long-wavelength region side, so that sensitivity can be improved over a large wavelength region even when the photoactive layer is made of the same Si material. That is, when the tandem structure is made of Si having different crystallinities, the spectral sensitivity becomes high, so that the light can be used with high efficiency. At this time, the material having a low crystallinity has to be provided on the side of the light acceptance surface to implement high light use efficiency. In addition, when the crystallinity is 40% or less, an amorphous component increases, and deterioration is generated.

3.2 Photoelectric Conversion Part Using Compound Semiconductor

As for the photoelectric conversion part using the compound semiconductor, for example, a pn junction is formed using GaP, GaAs, InP, or InAs formed of III-V group elements, CdTe/CdS formed of II-VI group elements, or CIGS (Copper Indium Gallium DiSelenide) formed of I-III-VI group elements.

A method for producing the photoelectric conversion part 2 using the compound semiconductor is shown below as one example, and in this method, film forming processes and the like are all sequentially performed with an MOCVD (Metal Organic Chemical Vapor Deposition) device. As a material for the III group element, an organic metal such as trimethylgallium, trimethylaluminum, or trimethylindium is supplied to a growth system using hydrogen gas as a carrier gas. As a material for the V group element, a gas such as arsine ($AsH_3$), phosphine ($PH_3$), or stibine ($SbH_3$) is used. As a p-type impurity or n-type impurity dopant, diethylzinc or the like is used to make the p type, or silane ($SiH_4$), disilane ($Si_2H_6$), hydrogen selenide ($H_2Se$), or the like is used to make the n type. When the above raw material gas is supplied onto the substrate heated to 700° C. and pyrolyzed, a desired compound semiconductor material film can be epitaxially grown. A composition of the grown layer can be controlled by an introduced gas composition, and a film thickness thereof can be controlled by an introduction time length of the gas. When the photoelectric conversion part is provided as the multi-junction laminated layers, the grown layers can be excellent in crystalline property by matching lattice constants between the layers as much as possible, so that photoelectric conversion efficiency can be improved.

In order to enhance carrier collection efficiency, a well-known window layer may be provided on the side of the light acceptance surface or a well-known electric field layer may be provided on the side of a non-light acceptance surface, in addition to the part in which the pn junction is formed. In addition, a buffer layer may be provided to prevent the impurity from being diffused.

3-3. Photoelectric Conversion Part Using Dye Sensitizer

The photoelectric conversion part using the dye sensitizer is mainly formed of a porous semiconductor, a dye sensitizer, an electrolyte, and a solvent, for example.

As a material for the porous semiconductor, one kind or more can be selected from well-known semiconductors made of titanium oxide, tungsten oxide, zinc oxide, barium titanate, strontium titanate, cadmium sulfide, and the like. Methods for forming the porous semiconductor on the substrate include a method in which a paste containing semiconductor particles is applied by a method such as a screen printing method or an ink-jet method and is dried or baked, a method in which a film is formed by a method such as the CVD method using a raw material gas, a PVD method, a deposition method, a sputtering method, a sol-gel method, and a method using an electrochemical redox reaction.

As the dye sensitizer which is adsorbed to the porous semiconductor, various kinds of dyes which are absorbed to a visible light region and an infrared light region can be used. Here, in order to strongly adsorb the dye to the porous semiconductor, it is preferable that a dye molecule contains a group such as a carboxylic acid group, a carboxylic acid anhydride group, an alkoxy group, a sulfonic acid group, a hydroxyl group, a hydroxylalkyl group, an ester group, a mercapto group, or a phosphoryl group. These functional groups provide electric coupling to easily move an electron between an excited state dye and a conduction band of the porous semiconductor.

Dyes containing the functional groups include a ruthenium bipyridine series dye, quinone series dye, quinonimine series dye, azo series dye, quinacridone series dye, squarylium series dye, cyanine series dye, merocyanine series dye, triphenylmethane series dye, xanthine series dye, porphyrin series dye, phthalocyanine series dye, perylene series dye, indigo series dye, and naphthalocyanine series dye.

Methods for adsorbing the dye to the porous semiconductor include a method in which the porous semiconductor is dipped in a solution including the dye dissolved therein (dye adsorbing solution). The solvents used in the dye adsorbing solution are not limited in particular as long as they can dissolve the dye, and more specifically include alcohol such as ethanol or methanol, ketone such as acetone, ether such as diethylether or tetrahydrofuran, a nitrogen compound such as acetonitrile, aliphatic hydrocarbon such as hexane, aromatic hydrocarbon such as benzene, ester such as ethyl acetate, and water.

The electrolyte is formed of a redox pair, and a liquid or a solid medium such as a polymer gel for holding the redox pair.

As the redox pair, a metal such as iron series or cobalt series, or a halogen substance such as chlorine, bromine, or iodine is preferably used, and a combination of metallic iodide such as lithium iodine, sodium iodine, or potassium iodine, and iodine is preferably used. Furthermore, an imidazole salt such as dimethyl-propyl-imidazole-iodide may be mixed therein.

As the solvent, while a carbonate compound such as propylene carbonate, a nitrile compound such as acetonitrile, alcohol such as ethanol or methanol, water, a polar aprotic substance, or the like is used, among them, the carbonate compound or the nitrile compound is preferably used.

3-4. Photoelectric Conversion Part Using Organic Thin Film

The photoelectric conversion part using the organic thin film may be an electron hole transport layer formed of an organic semiconductor material having an electron-donating property and an electron-accepting property, or lamination of an electron transport layer having the electron-accepting property and a hole transport layer having the electron-donating property.

While the organic semiconductor material having the electron-donating property is not limited in particular as long as it has a function as an electron donor, it is preferable that a film can be formed by a coating method, and especially, a conductive polymer having the electron-donating property is preferably used.

Here, the conductive polymer means a π-conjugated polymer formed of a π-conjugated system in which a double bond or triple bond containing carbon-carbon or a heteroatom is adjacent to a single bond alternately, while showing a semiconducting property.

The material for the conductive polymer having the electron-donating property may be polyphenylene, polyphenylenevinylene, polythiophene, polycarbazole, polyvinyl carbazole, polysilane, polyacetylene, polypyrrole, polyaniline, polyfluorene, polyvinyl pyrene, polyvinyl anthracene, a derivative or a copolymer thereof, a phthalocyanine-containing polymer, a carbazole-containing polymer, an organometallic polymer, or the like. Especially, a preferably used material may be tiophene-fluorene copolymer, polyalkyl thiophne, phenyleneethynylene-phenylenevinylene copolymer, fluorene-phenylene vinylene copolymer, tiophene-phenylenevinylene copolymer, or the like.

While the material for the organic semiconductor having the electron-accepting property is not limited in particular as long as it has a function as an electron acceptor, it is preferable that a film can be formed by a coating method and especially, a conductive polymer having the electron-donating property is preferably used.

As the conductive polymers having the electron-accepting property, it may be polyphenylenevinylene, polyfluorene, a derivative or a copolymer thereof, carbon nanotube, fullerene, a derivative thereof, a polymer containing a CN group or a $CF_3$ group, and a $CF_3$-substituted polymer thereof.

Alternatively, an organic semiconductor material having the electron-accepting property doped with an electron donating compound, or an organic semiconductor material having the electron-donating property doped with an electron accepting compound may be used. A material for the conductive polymer having the electron-accepting property doped with the electron donating compound may be the above-described conductive polymer material having the electron-accepting property. The electron donating compound to be doped may be a Lewis base such as an alkali metal or an alkali earth metal such as Li, K, Ca, or Cs. The Lewis base acts as the electron donor. In addition, the material for the conductive polymer having the electron-donating property doped with the electron accepting compound may be the above-described conductive polymer material having the electron-donating property. The electron accepting compound to be doped may be a Lewis acid such as $FeCl_3$, $AlCl_3$, $AlBr_3$, $AsF_6$, or a halogen compound. The Lewis acid acts as the electron acceptor.

3-5. Photoelectric Conversion Part that Generates Electromotive Force Between First and Second Regions on Back Surface As a method of forming the photoelectric conversion part 2 for generating the electromotive force between the first and second regions on the back surface, there is a method in which a semiconductor wafer is used as a material, and a p-type semiconductor part 36 and an n-type semiconductor part 37 are formed in such a manner that a part of the p-type semiconductor part 36 and a part of the n-type semiconductor part 37 are formed respectively on the back surface of the semiconductor wafer, as illustrated in FIGS. 11 and 12. When light is incident on the light acceptance surface of the photoelectric conversion part 2 thus formed, a potential difference can be generated between a region on the back surface of the photoelectric conversion part where the p-type semiconductor part 36 is formed and a region on the back surface of the photoelectric conversion part where the n-type semiconductor part 37 is formed.

When the p-type semiconductor part 36 and the n-type semiconductor part 37 are formed to be in contact with the semiconductor wafer, a pn junction can be formed on the photoelectric conversion part 2. When the p-type semiconductor part 36 and the n-type semiconductor part 37 are formed not to be in contact with the semiconductor wafer made of an i-type semiconductor, a pin junction can be formed on the photoelectric conversion part. When a semiconductor wafer made of a p-type semiconductor is used, the photoelectric conversion part 2 having an npp$^+$ junction can be formed, and when a semiconductor wafer made of an n-type semiconductor is used, the photoelectric conversion part 2 having a pnn$^+$ junction can be formed.

As illustrated in FIG. 11, one p-type semiconductor part 36 and one n-type semiconductor part 37 can be formed on the semiconductor wafer, or one of the p-type semiconductor part 36 and the n-type semiconductor part 37 can be formed in plural numbers. Alternatively, one of the p-type semiconductor part 36 and the n-type semiconductor part 37 may be formed on one portion of the semiconductor wafer, and the other may be formed on both sides thereof.

While it is primarily assumed that the above photoelectric conversion part 2 receives sunlight and performs the photoelectric conversion, it can be irradiated, depending on applications, with artificial light such as light emitted from a fluorescent lamp, an incandescent lamp, an LED, or a specific heat source to perform the photoelectric conversion.

4. Second Electrode

The second electrode 5 can be provided on the back surface of the photoelectric conversion part 2, and can electrically be connected to the changeover part 10. The second electrode 5 can also be electrically connected to the first electrolysis electrode 8 as illustrated in FIGS. 5, and 7 to 11. When the first electrolysis electrode 8 is provided on the back surface of the photoelectric conversion part 2 as illustrated in FIGS. 5, 7, 8, and 10, the first electrolysis electrode 8 has the function same as that of the second electrode 5, so that the second electrode 5 can be eliminated.

By providing the second electrode 5, a large current can flow between the back surface of the photoelectric conversion part 2 and the changeover part 10. When the second electrode 5 is electrically connected to the first electrolysis electrode 8 as illustrated in FIGS. 5, and 7 to 10, the electromotive force generated by the photoelectric conversion part 2 can efficiently be outputted to the first electrolysis electrode 8 and the second electrolysis electrode 7.

While the second electrode 5 is not limited in particular as long as it has conductivity, it may be a metal thin film, such as a thin film made of Al, Ag, or Au. The film can be formed by a sputtering method or the like. Alternatively, it may be a transparent conductive film made of a material such as In—Zn—O (IZO), In—Sn—O (ITO), ZnO—Al, Zn—Sn—O, or $SnO_2$.

5. Insulation Part

The insulation part 11 can be provided between the second electrode 5 and the first and second electrolysis electrodes 8 and 7 as illustrated in FIGS. 2 and 6.

The formation of the insulation part 11 can prevent a structure in which the second electrode 5 and the first and second electrolysis electrodes 8 and 7 are electrically connected not through the changeover part 10. By virtue of this, when the electromotive force generated by the irradiation of the photoelectric conversion part 2 with light is outputted to the first external circuit, a flow of a leak current through the first electrolysis electrode 8 and the second electrolysis electrode 7 can be prevented.

Figure 5:
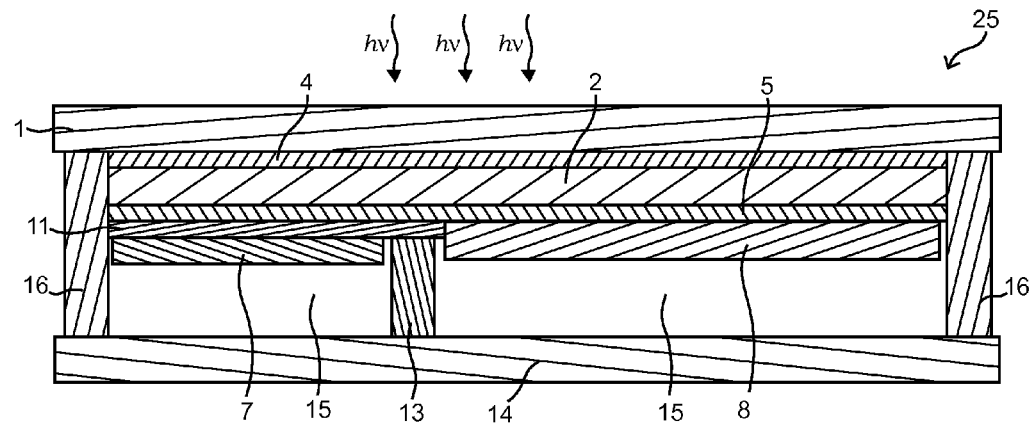
FIG. 5 is a schematic cross-sectional view of the solar-cell-integrated gas production device according to an embodiment of the present invention.

The insulation part 11 may be provided between the second electrode 5 and the second electrolysis electrode 7 as illustrated in FIGS. 5, 7, and 8. This configuration can prevent that the second electrolysis electrode 7 is electrically connected to the second electrode 5 not through the changeover part 10, thereby being capable of preventing the flow of the leak current.

The insulation part 11 may be provided between the photoelectric conversion layers 28, which are connected in series, and the second electrolysis electrode 7 as illustrated in FIG. 9, or may be provided between the photoelectric conversion part 2 and the first and second electrolysis electrodes 8 and 7 excluding the portion where the first electrolysis electrode 8 and the first region are electrically connected, and the portion where the second electrolysis electrode 7 and the second region are electrically connected, as illustrated in FIGS. 11 and 12.

In addition, the insulation part 11 can be formed to cover the side face of the photoelectric conversion part 2 as illustrated in FIGS. 8 and 9. By virtue of this configuration, the second electrolysis electrode 7 or the first conductive part 9 can be formed on the insulation part 11 covering the side face of the photoelectric conversion part 2, whereby the occurrence of the leak current can be prevented, even if the second electrolysis electrode 7 or the first conductive part 9 is formed to be in contact with the first electrode 4.

The insulation part 11 can be made of either an organic material or an inorganic material, and the organic material may be an organic polymer such as polyamide, polyimide, polyarylene, an aromatic vinyl compound, a fluorine series polymer, an acrylic series polymer, or a vinyl amide series polymer, while the inorganic material may be a metal oxide such as $Al_2O_3$, $SiO_2$ such as a porous silica film, a fuluoridated silicon oxide film (FSG), SiOC, an HSQ (Hydrogen Silsesquioxane) film, $SiN_x$, or silanol $Si(OH)_4$).

A method for forming the insulation part 11 may be a method in which a paste containing an insulation material is applied by a screen printing method, inkjet method, or spin coating method and then dried or baked, a method in which a film is formed by a method such as the CVD method using a raw material gas, PVD method, deposition method, sputtering method, or sol-gel method.

6. First Conductive Part

The first conductive part 9 can electrically connect the second electrolysis electrode 7 and the first electrode 4 as illustrated in FIGS. 6, 7, and 9. Thus, the second electrolysis electrode 7 can be formed on the back surface of the photoelectric conversion part 2, and the second electrolysis electrode 7 can be electrically connected to the first electrode 4.

The first conductive part 9 can be in contact with the first electrode 4 which is in contact with the light acceptance surface of the photoelectric conversion part 2 and the second electrolysis electrode 7 provided on the back surface of the photoelectric conversion part 2, so that when the cross-sectional area of the first conductive part 9 which is parallel with the light acceptance surface of the photoelectric conversion part 2 is too large, an area of the light acceptance surface of the photoelectric conversion part 2 becomes small. Meanwhile, when the cross-sectional area of the first conductive part 9 which is parallel with the light acceptance surface of the photoelectric conversion part 2 is too small, a difference is generated between the potential of the light acceptance surface of the photoelectric conversion part 2 and the potential of the second electrolysis electrode 7, so that the potential difference required for electrolyzing the electrolytic solution could not be provided and generation efficiency of the first gas or the second gas could be lowered. Therefore, the cross-sectional area of the first conductive part 9 which is parallel to the light acceptance surface of the photoelectric conversion part 2 needs to be set within a certain range. For example, the cross-sectional area of the first conductive part 9 which is parallel to the light acceptance surface of the photoelectric conversion part 2 (when the plurality of first conductive parts are provided, their total) may be 0.1% or more to 10% or less, preferably 0.5% or more to 8% or less, and more preferably 1% or more to 6% or less when it is assumed that the area of the light acceptance surface of the photoelectric conversion part 2 is 100%.

In addition, the first conductive part 9 may be provided in a contact hole which penetrates the photoelectric conversion part 2. In this case, the decrease in area of the light acceptance surface of the photoelectric conversion part 2 because of the presence of the first conductive part 9 can be smaller. In addition, in this case, a current path between the light acceptance surface of the photoelectric conversion part 2 and the second electrolysis electrode 7 can be short, so that the first gas or the second gas can be generated more efficiently. In addition, in this case, the cross-sectional area of the first conductive part 9 which is parallel to the light acceptance surface of the photoelectric conversion part 2 can be easily adjusted. For example, the second electrolysis electrode 7 and the first electrode 4 can be electrically connected through the first conductive part 9 formed on the contact hole penetrating the photoelectric conversion part 2, as illustrated in the sectional view of the solar-cell-integrated gas production device 25 according to the present embodiment in FIGS. 6 and 7.

Furthermore, the number of the contact hole provided with the first conductive part 9 may be one or more, and the contact hole may have a circular cross-section. In addition, when the cross-sectional area of the contact hole which is parallel to the light acceptance surface of the photoelectric conversion part 2 (when the plurality of contact holes are provided, their total) may be 0.1% or more to 10% or less, preferably 0.5% or more to 8% or less, and more preferably 1% or more to 6% or less when it is assumed that the area of the light acceptance surface of the photoelectric conversion part 2 is 100%.

In addition, the first conductive part 9 may be provided on the insulation part 11 that covers the side face of the photoelectric conversion part 2 as illustrated in FIG. 9

A material for the first conductive part 9 is not limited in particular as long as it has conductivity. Methods include a method in which a paste containing conductive particles such as carbon paste or Ag paste is applied by a screen printing method, or inkjet method and then dried or baked, a method in which a film is formed by a method such as the CVD method using a raw material gas, PVD method, deposition method, sputtering method, sol-gel method, and method using electrochemical redox reaction.

7. Second Conductive Part

The second conductive part 29 may be provided between the insulation part 11 and the first electrolysis electrode 8, or between the insulation part 11 and the second electrolysis electrode 7. By providing the second conductive part 29, the electromotive force generated by the light incidence into the photoelectric conversion part 2 can efficiently be outputted to the first electrolysis electrode 8 or the second electrolysis electrode 7, even when the electric conductivity of the first electrolysis electrode 8 or the second electrolysis electrode 7 is relatively low. The first electrolysis electrode 8 may be electrically connected to the changeover part 10 through the second conductive part 29, or the second electrolysis electrode 7 may be electrically connected to the changeover part 10 or the first electrode 4 through the second conductive part 29 as illustrated in FIG. 9. When the photoelectric conversion part 2 generates the electromotive force between the first and second regions on its back surface as illustrated in FIGS. 11 and 12, the first electrolysis electrode 8 and the second electrolysis electrode 7 may be electrically connected to the first region and the second region through the second conductive part 29, respectively.

A material for the second conductive part 29 is not limited in particular as long as it has conductivity. Methods include a method in which a paste containing conductive particles such as carbon paste or Ag paste is applied by a screen printing method, or inkjet method and then dried or baked, a method in which a film is formed by a method such as the CVD method using a raw material gas, PVD method, deposition method, sputtering method, sol-gel method, and method using electrochemical redox reaction.

8. First Electrolysis Electrode, Second Electrolysis Electrode

The first electrolysis electrode 8 and the second electrolysis electrode 7 are respectively provided on the back surface of the photoelectric conversion part 2. By virtue of this configuration, the first electrolysis electrode 8 and the second electrolysis electrode 7 do not block the light incident on the photoelectric conversion part 2.

Figure 13:
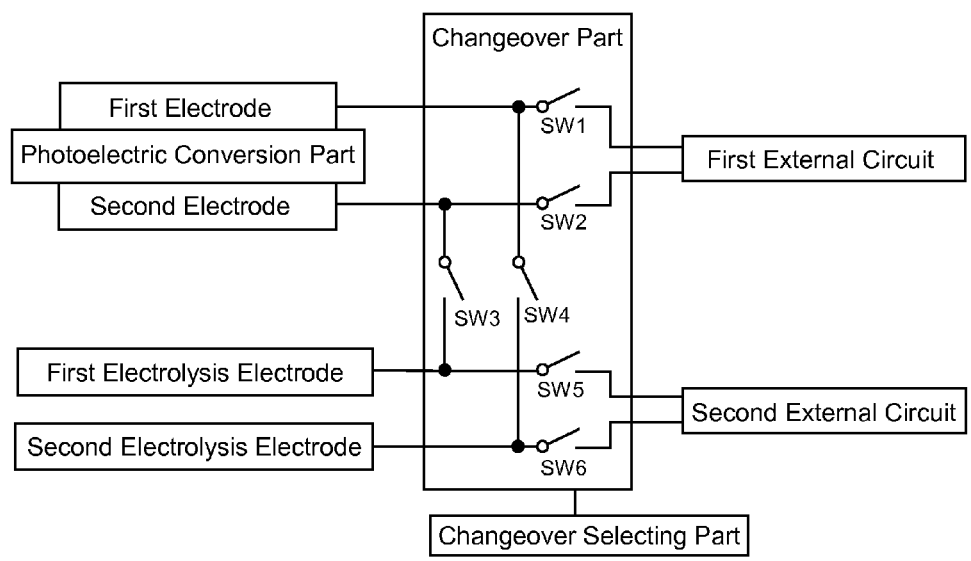
FIG. 13 is a schematic circuit diagram of the solar-cell-integrated gas production device according to an embodiment of the present invention.

The first electrolysis electrode 8 and the second electrolysis electrode 7 can be electrically connected to the changeover part 10. For example, when the solar-cell-integrated gas production device 25 according to the present embodiment has the cross-section illustrated in FIG. 2, and has the electric circuit illustrated in FIG. 13, the first electrode 4 and the second electrode 5 can electrically be connected to the first electrolysis electrode 8 and the second electrolysis electrode 7, respectively, via the changeover part 10. With this configuration, the first electrolysis electrode 8 and the second electrolysis electrode 7 can be electrically connected to the light acceptance surface or the back surface of the photoelectric conversion part 2 through the changeover part 10. Thus, the electromotive force generated by the light incidence into the photoelectric conversion part 2 can be outputted to the first electrolysis electrode 8 and the second electrolysis electrode 7.

One of the first electrolysis electrode 8 and the second electrolysis electrode 7 can be electrically connected to the changeover part 10. For example, when the solar-cell-integrated gas production device 25 according to the present embodiment has the cross-section illustrated in FIGS. 5 and 10, and has the electric circuit illustrated in FIG. 14, or when the solar-cell-integrated gas production device 25 according to the present embodiment has the cross-section illustrated in FIG. 6, and has the electric circuit illustrated in FIG. 15, the light acceptance surface and the back surface of the photoelectric conversion part 2 can electrically be connected to the first electrolysis electrode 8 and the second electrolysis electrode 7. With this configuration, the electromotive force generated by the light incidence into the photoelectric conversion part 2 can be outputted to the first electrolysis electrode 8 and the second electrolysis electrode 7. When the solar-cell-integrated gas production device 25 has the cross-section illustrated in FIG. 10, the second electrode 5 can be eliminated, and the electric circuit can be the one illustrated in FIG. 17.

The first electrolysis electrode 8 and the second electrolysis electrode 7 can be electrically connected to the second electrode 5 and the first electrode 4, respectively. For example, when the solar-cell-integrated gas production device 25 according to the present embodiment has the cross-section illustrated in FIGS. 7, 8, and 9, and has the electric circuit illustrated in FIG. 16, the light acceptance surface and the back surface of the photoelectric conversion part 2 can electrically be connected to the first electrolysis electrode 8 and the second electrolysis electrode 7. With this configuration, the electromotive force generated by the light incidence into the photoelectric conversion part 2 can be outputted to the first electrolysis electrode 8 and the second electrolysis electrode 7. When the solar-cell-integrated gas production device 25 has the cross-section illustrated in FIGS. 11 and 12, the solar-cell-integrated gas production device may have an electric circuit in which the first electrode illustrated in FIG. 16 can be the second conductive part 29 provided between the second electrolysis electrode 7 and the photoelectric conversion part 2, and the second electrode illustrated in FIG. 16 can be the second conductive part 29 provided between the first electrolysis electrode 8 and the photoelectric conversion part 2.

The first electrolysis electrode 8 and the second electrolysis electrode 7 are provided to be immersible into the electrolytic solution. This can progress the electrolysis reaction of the electrolytic solution on the surface of the first electrolysis electrode 8 and the second electrolysis electrode 7, whereby the first gas and the second gas can be generated. One of the first gas and the second gas can be hydrogen gas, and the other can be oxygen gas.

The first electrolysis electrode 8 and the second electrolysis electrode 7 can be provided not to be in contact with each other. This configuration can prevent the leak current from flowing between the first electrolysis electrode 8 and the second electrolysis electrode 7.

One of the first electrolysis electrode 8 and the second electrolysis electrode 7 may be a hydrogen generation part that generates $H_2$ from the electrolytic solution, and the other may be an oxygen generation part that generates $O_2$ from the electrolytic solution. Thus, the solar-cell-integrated gas production device according to the present embodiment can decompose water contained in the electrolytic solution so as to generate hydrogen gas and oxygen gas, which serve as the fuel of the fuel cell.

9. Hydrogen Generation Part

The hydrogen generation part is the part to generate $H_2$ from the electrolytic solution, and it is the first electrolysis electrode 8 or the second electrolysis electrode 7. In addition, the hydrogen generation part may contain a catalyst for the reaction to generate $H_2$ from the electrolytic solution. In this case, the reaction rate to generate $H_2$ from the electrolytic solution can increase. The hydrogen generation part may be formed of only the catalyst for the reaction to generate $H_2$ from the electrolytic solution, and the catalyst may be supported by a carrier. In addition, the hydrogen generation part may have a catalytic surface area larger than the area of the light acceptance surface of the photoelectric conversion part 2. In this case, the reaction rate to generate $H_2$ from the electrolytic solution can become higher. In addition, the hydrogen generation part may be a catalyst-supporting porous conductor. In this case, the catalytic surface area can increase. In addition, the potential can be prevented from varying due to the current flowing between the light acceptance surface or the back surface of the photoelectric conversion part 2 and the catalyst contained in the hydrogen generation part. In addition, the hydrogen generation part may contain at least one of Pt, Ir, Ru, Pd, Rh, Au, Fe, Ni, and Se as a hydrogen generation catalyst.

The catalyst for the reaction to generate $H_2$ from the electrolytic solution (hydrogen generation catalyst) is provided to promote conversion from two protons and two electrons to one hydrogen molecule, and can be made of a material which is chemically stable and having a small hydrogen generation overvoltage. Examples of the hydrogen generation catalyst include: a platinum group metal such as Pt, Ir, Ru, Pd, Rh, or Au having a catalytic activity for hydrogen, an alloy thereof, and a compound containing the platinum group metal; and an alloy containing any of metals such as Fe, Ni and Se constituting an activity center of a hydrogenase as a hydrogen generating enzyme, and a compound containing the metal, and these examples and combinations thereof can be desirably used as the hydrogen generation catalyst. Among them, Pt and a nanostructured body containing Pt are preferably used because their hydrogen generation overvoltage is low. A material such as CdS, CdSe, ZnS, or $ZrO_2$ which generate the hydrogen generation reaction by light irradiation can be also used.

The hydrogen generation catalyst can be supported on a conductor in order to increase the reaction area more to improve the gas generation rate. As the conductor to support the catalyst, it may be a metal material, a carbonaceous material, or an inorganic material having conductivity.

The metal material is preferably a material having electron conductivity and having corrosion resistance under an acidic atmosphere. More specifically, the material may be a noble metal such as Au, Pt, or Pd, a metal such as Ti, Ta, W, Nb, Ni, Al, Cr, Ag, Cu, Zn, Su, or Si, a nitride and carbide of the above metal, a stainless steel, or an alloy such as Cu—Cr, Ni—Cr, or Ti—Pt. The metal material more preferably contains at least one element selected from a group including Pt, Ti, Au, Ag, Cu, Ni, and W because another chemical side reaction is hardly generated. This metal material is relatively low in electric resistance and can prevent a voltage from being lowered even when a current is drawn in a surface direction. In addition, when the metal material having poor corrosion resistance under the acidic atmosphere such as Cu, Ag, or Zn is used, a surface of the metal material having the poor corrosion resistance may be coated with a noble metal or metal having the corrosion resistance such as Au, Pt, or Pd, carbon, graphite, glassy carbon, a conductive polymer, conductive nitride, conductive carbide, or conductive oxide.

As the carbonaceous material, it is preferable that it is chemically stable and has conductivity. For example, the material may be carbon powder or carbon fiber such as acetylene black, vulcanized fiber, ketjen black, furnace black, VGCF, carbon nanotube, carbon nanohorn, or fullerene.

As the inorganic material having the conductivity, it may be In—Zn—O (IZO), In—Sn—O (ITO), ZnO—Al, Zn—Sn—O, $SnO_2$, or antimony oxide doped tin oxide.

In addition, as the conductive polymer, it may be polyacethylene, polythiophene, polyaniline, polypyrrole, polyparaphenylene, or polyparaphenylenevinylene, and as the conductive nitride, it may be carbon nitride, silicon nitride, gallium nitride, indium nitride, germanium nitride, titanium nitride, zirconium nitride, or thallium nitride, and as the conductive carbide, it may be tantalum carbide, silicon carbide, zirconium carbide, titanium carbide, molybdenum carbide, niobium carbide, iron carbide, nickel carbide, hafnium carbide, tungsten carbide, vanadium carbide, or chrome carbide, and as the conductive oxide, it may be tin oxide, indium tin oxide (ITO), or antimony oxide doped tin oxide.

A structure of the conductor to support the hydrogen generation catalyst may be preferably selected from a plate shape, foil shape, rod shape, mesh shape, lath plate shape, porous plate shape, porous rod shape, woven cloth shape, unwoven cloth shape, fiber shape, and a felt shape. In addition, the conductor having a groove formed by being pressed in a surface of a felt-shape electrode is preferably used because it can reduce electric resistance and flow resistance of an electrode liquid.

10. Oxygen Generation Part

The oxygen generation part is the part to generate $O_2$ from the electrolytic solution, and it is the first electrolysis electrode 8 or the second electrolysis electrode 7. In addition, the oxygen generation part may contain a catalyst for the reaction to generate $O_2$ from the electrolytic solution. In this case, the reaction rate to generate $O_2$ from the electrolytic solution can increase. The oxygen generation part may be formed of only the catalyst for the reaction to generate $O_2$ from the electrolytic solution, and the catalyst may be supported by a carrier. In addition, the oxygen generation part may have a catalytic surface area larger than the area of the light acceptance surface of the photoelectric conversion part 2. In this case, the reaction rate to generate $O_2$ from the electrolytic solution can increase. In addition, the oxygen generation part may be a catalyst-supporting porous conductor. Thus, the catalytic surface area can increase. In addition, the potential can be prevented from varying due to the current flowing between the light acceptance surface or the back surface of the photoelectric conversion part 2 and the catalyst contained in the oxygen generation part. Furthermore, the oxygen generation part may contain at least one of Mn, Ca, Zn, Co, and Ir, as an oxygen generation catalyst.

The catalyst for the reaction to generate $O_2$ from the electrolytic solution (oxygen generation catalyst) is provided to promote conversion from two water molecules to one oxygen, four protons and four electrons, and made of a material which is chemically stable and having a small oxygen generation overvoltage. For example, the materials include an oxide or compound containing Mn, Ca, Zn or Co serving as an active center of Photosystem II which is an enzyme to catalyze the reaction to generate oxygen from water using light, a compound containing a platinum group metal such as Pt, $RuO_2$, or $IrO_2$, an oxide or a compound containing a transition metal such as Ti, Zr, Nb, Ta, W, Ce, Fe, or Ni, and a combination of the above materials. Among them, an iridium oxide, manganese oxide, cobalt oxide, or cobalt phosphate is preferably used because an overvoltage is low and oxygen generation efficiency is high.

The oxygen generation catalyst can be supported on a conductor in order to increase the reaction area more, and to increase the gas generation rate. As the conductors to support the catalyst, it may be a metal material, a carbonaceous material, or an inorganic material having conductivity. Their explanations are relevant to those described for the hydrogen generation part in "9. Hydrogen generation part" as long as there is no inconsistency.

When the catalytic activities of the single hydrogen generation catalyst and the single oxygen generation catalyst are small, an auxiliary catalyst may be used, such as an oxide of Ni, Cr, Rh, Mo, Co, or Se or a compound of them.

In addition, a method for supporting the hydrogen generation catalyst and the oxygen generation catalyst may be a method performed by directly applying it to the conductor or the semiconductor, a PVD method such as a vapor deposition method, sputtering method, or ion plating method, a dry coating method such as a CVD method, or an electro-crystallization method, depending on the material. In addition, when the catalytic activities for the hydrogen generation and the oxygen generation are not sufficient, the catalyst is supported on a porous body, a fibrous substance or a nanoparticle of metal or carbon, to increase the reaction surface area, whereby the hydrogen and oxygen generation rate can be improved.

11. Changeover Part

The changeover part 10 can change the circuit that outputs the electromotive force, generated by irradiating the photoelectric conversion part 2 with light, to the first external circuit, and the circuit that outputs the electromotive force, generated by irradiating the photoelectric conversion part 2 with light, to the first electrolysis electrode 8 and the second electrolysis electrode 7 so as to generate the first gas and the second gas respectively from the electrolytic solution. With this configuration, the electromotive force generated by irradiating the photoelectric conversion part 2 with light can be supplied to the first external circuit as power, and the first gas and the second gas can be produced by using the electromotive force generated by irradiating the photoelectric conversion part 2 with light.

The method of electrically connecting the changeover part 10 with the first external circuit is not limited in particular. For example, the changeover part 10 may have an output terminal 22, and the changeover part 10 may be electrically connected to the first external circuit via the output terminal 22.

In addition, the changeover part 10 can be electrically connected to the second external circuit, and it can make a changeover to the circuit that outputs the electromotive force, generated by irradiating the photoelectric conversion part 2 with light, to the first electrolysis electrode 8 and the second electrolysis electrode 7, so as to generate the first gas and the second gas respectively from the electrolytic solution. Thus, the first gas and the second gas can be produced from the electrolytic solution by utilizing the electromotive force inputted from the second external circuit.

The method of electrically connecting the changeover part 10 with the second external circuit is not limited in particular. For example, the changeover part 10 may have an input terminal 23, and the changeover part 10 may be electrically connected to the second external circuit via the input terminal 23.

The changeover part 10 will be described in detail with reference to the drawings. In case where the solar-cell-integrated gas production device 25 according to the present embodiment has the cross-section illustrated in FIG. 2, and has the electric circuit illustrated in FIG. 13, for example, the electromotive force generated by irradiating the photoelectric conversion part 2 with light can be outputted to the first external circuit, when a SW (switch) 1 and a SW 2 are turned ON, and a SW3 and a SW4 are turned OFF. When the SW1, the SW2, a SW5, and a SW6 are turned OFF, and the SW3 and the SW4 are turned ON, the electromotive force generated by irradiating the photoelectric conversion part 2 with light can be outputted to the first electrolysis electrode 8 and the second electrolysis electrode 7.

For example, when the SW3 and the SW4 are turned OFF, and the SW5 and the SW6 are turned ON, the electromotive force inputted from the second external circuit can be outputted to the first electrolysis electrode 8 and the second electrolysis electrode 7. When the SW1 and the SW2 are turned OFF, and the SW3, the SW4, the SW5, and the SW6 are turned ON, the electromotive force generated by irradiating the photoelectric conversion part 2 with light and the electromotive force inputted from the second external circuit can both be outputted to the first electrolysis electrode 8 and the second electrolysis electrode 7.

Figure 10:
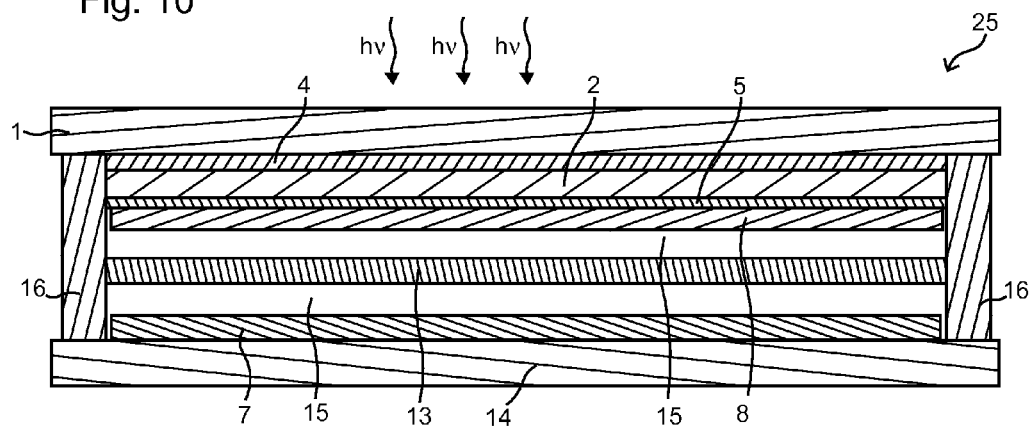
FIG. 10 is a schematic cross-sectional view of the solar-cell-integrated gas production device according to an embodiment of the present invention.
Figure 14:
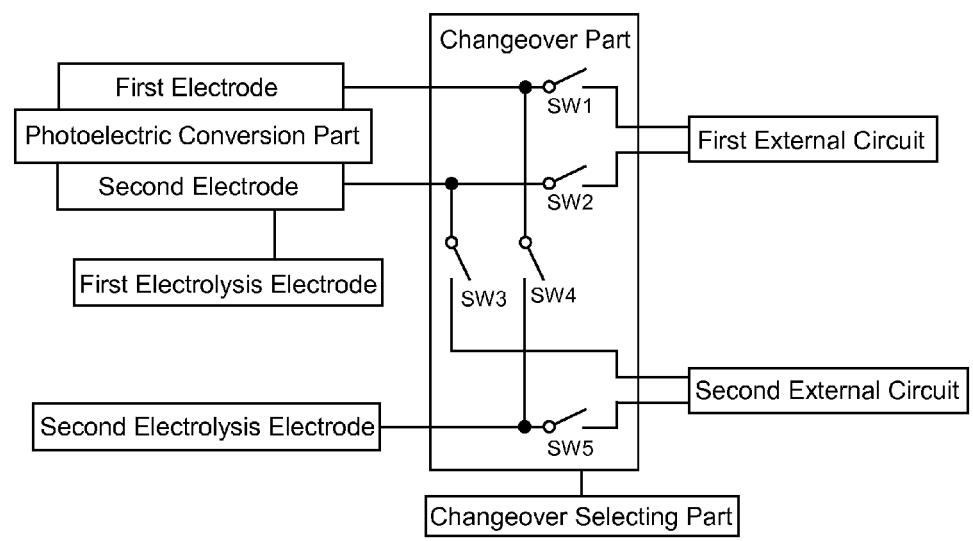
FIG. 14 is a schematic circuit diagram of the solar-cell-integrated gas production device according to an embodiment of the present invention.
Figure 17:
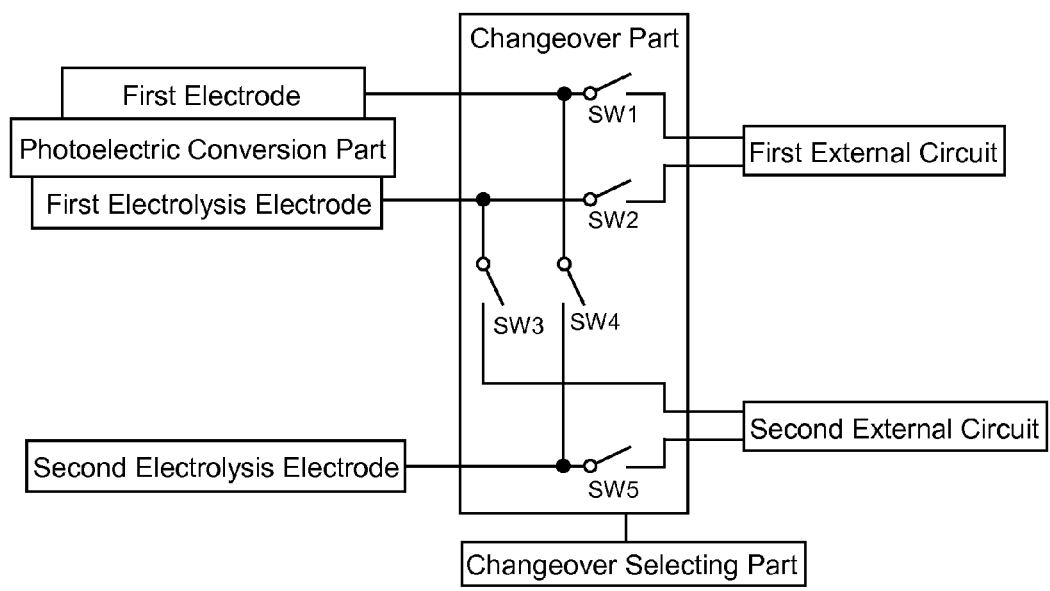
FIG. 17 is a schematic circuit diagram of the solar-cell-integrated gas production device according to an embodiment of the present invention.

In case where the solar-cell-integrated gas production device 25 according to the present embodiment has the cross-section illustrated in FIGS. 5 and 10, and has the electric circuit illustrated in FIG. 14, or has the electric circuit illustrated in FIG. 17, for example, the electromotive force generated by irradiating the photoelectric conversion part 2 with light can be outputted to the first external circuit, when the SW 1 and the SW 2 are turned ON, and the SW3 and the SW4 are turned OFF. When the SW1, the SW2, the SW3, and the SW5 are turned OFF, and the SW4 is turned ON, the electromotive force generated by irradiating the photoelectric conversion part 2 with light can be outputted to the first electrolysis electrode 8 and the second electrolysis electrode 7.

When the SW1, the SW2, and the SW4 are turned OFF, and the SW3 and the SW5 are turned ON, the electromotive force inputted from the second external circuit can be outputted to the first electrolysis electrode 8 and the second electrolysis electrode 7. When the SW1, and the SW2 are turned OFF, and the SW3, the SW4, and the SW5 are turned ON, the electromotive force generated by irradiating the photoelectric conversion part 2 with light and the electromotive force inputted from the second external circuit can both be outputted to the first electrolysis electrode 8 and the second electrolysis electrode 7.

Figure 15:
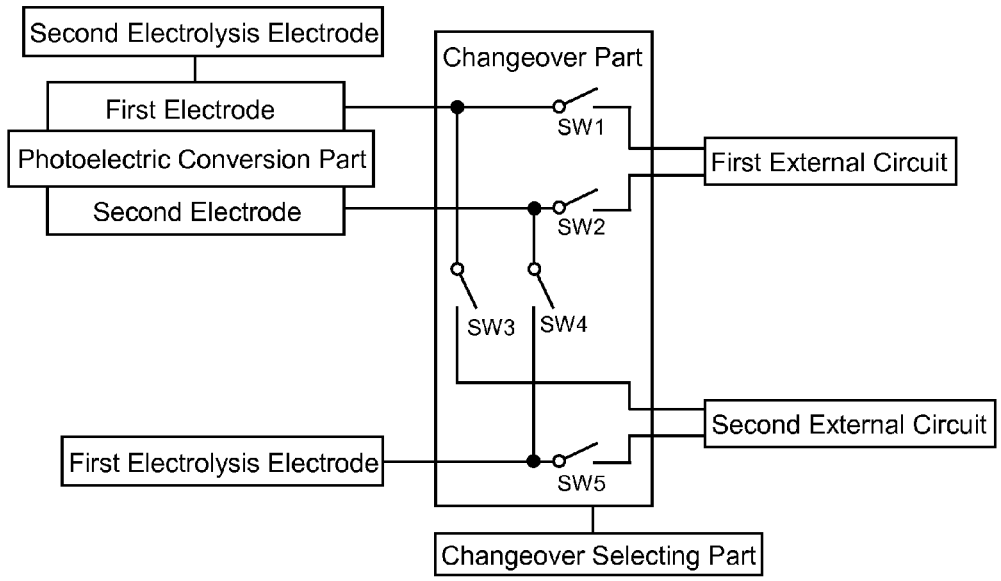
FIG. 15 is a schematic circuit diagram of the solar-cell-integrated gas production device according to an embodiment of the present invention.

In case where the solar-cell-integrated gas production device 25 according to the present embodiment has the cross-section illustrated in FIG. 6, and has the electric circuit illustrated in FIG. 15, for example, the electromotive force generated by irradiating the photoelectric conversion part 2 with light can be outputted to the first external circuit, when the SW 1 and the SW 2 are turned ON, and the SW3 and the SW4 are turned OFF. When the SW1, the SW2, the SW3, and the SW5 are turned OFF, and the SW4 is turned ON, the electromotive force generated by irradiating the photoelectric conversion part 2 with light can be outputted to the first electrolysis electrode 8 and the second electrolysis electrode 7.

When the SW1, the SW2, and the SW4 are turned OFF, and the SW3 and the SW5 are turned ON, the electromotive force inputted from the second external circuit can be outputted to the first electrolysis electrode 8 and the second electrolysis electrode 7. When the SW1, and the SW2 are turned OFF, and the SW3, the SW4, and the SW5 are turned ON, the electromotive force generated by irradiating the photoelectric conversion part 2 with light and the electromotive force inputted from the second external circuit can both be outputted to the first electrolysis electrode 8 and the second electrolysis electrode 7.

Figure 16:
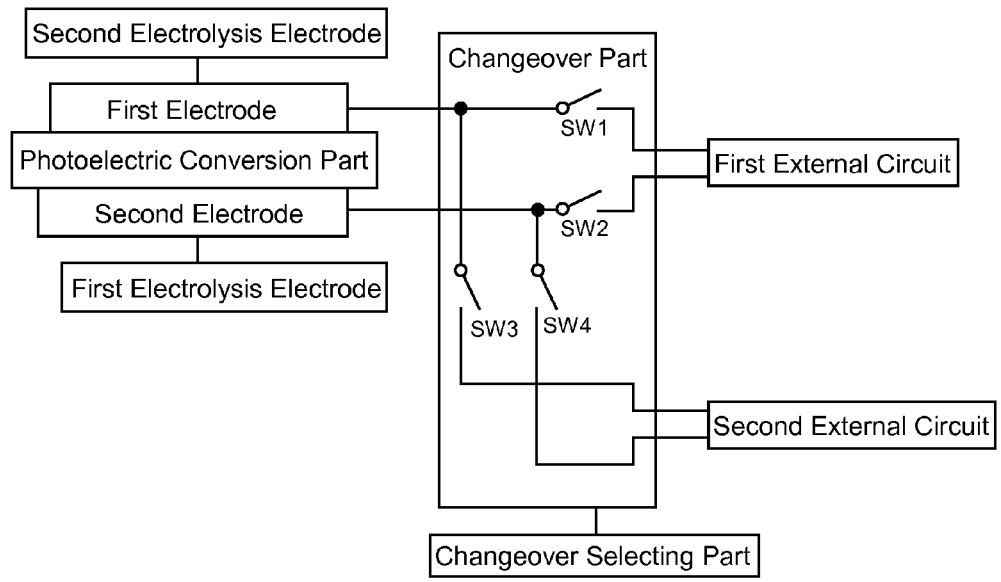
FIG. 16 is a schematic circuit diagram of the solar-cell-integrated gas production device according to an embodiment of the present invention.

In case where the solar-cell-integrated gas production device 25 according to the present embodiment has the cross-section illustrated in FIGS. 7, 8, and 9, and has the electric circuit illustrated in FIG. 16, for example, the electromotive force generated by irradiating the photoelectric conversion part 2 with light can be outputted to the first external circuit, when the SW 1 and the SW 2 are turned ON, the SW3 and the SW4 are turned OFF, and the electromotive force generated by irradiating the photoelectric conversion part 2 with light does not reach the electrolysis voltage of the electrolytic solution. When the SW1, the SW2, the SW3, and the SW5 are turned OFF, and the electromotive force generated by irradiating the photoelectric conversion part 2 with light reaches the electrolysis voltage of the electrolytic solution, the electromotive force generated by irradiating the photoelectric conversion part 2 with light can be outputted to the first electrolysis electrode 8 and the second electrolysis electrode 7. Accordingly, even if the solar-cell-integrated gas production device 25 has the electric circuit illustrated in FIG. 16, the circuit that outputs the electromotive force, generated by irradiating the photoelectric conversion part 2 with light, to the first external circuit, and the circuit that outputs the electromotive force, generated by irradiating the photoelectric conversion part 2 with light, to the first electrolysis electrode 8 and the second electrolysis electrode 7 can be switched by the changeover part 10.

When the SW3 and the SW4 are turned ON, and the SW1 and the SW2 are turned OFF, the electromotive force inputted from the second external circuit, or both of the electromotive force inputted from the second external circuit and the electromotive force generated by irradiating the photoelectric conversion part 2 with light can be outputted to the first electrolysis electrode 8 and the second electrolysis electrode 7.

In case where the solar-cell-integrated gas production device 25 according to the present embodiment has the cross-section illustrated in FIGS. 11 and 12, the solar-cell-integrated gas production device may have an electric circuit in which the first electrode illustrated in FIG. 16 can be the second conductive part 29 provided between the second electrolysis electrode 7 and the photoelectric conversion part 2, and the second electrode illustrated in FIG. 16 can be the second conductive part 29 provided between the first electrolysis electrode 8 and the photoelectric conversion part 2.

The changeover part 10 can input the result selected by a changeover selecting part 21, and can make a changeover of the circuit based upon the inputted selected result. Thus, the changeover part 10 can change the circuit to the circuit selected by the changeover selecting part 21.

The changeover part 10 can also make a changeover of the circuit based upon the magnitude of the electromotive force generated by irradiating the photoelectric conversion part 2 with light. Therefore, when the power outputted to the first external circuit is generated in the photoelectric conversion part 2, the electromotive force generated in the photoelectric conversion part 2 can be outputted to the first external circuit, and when the power outputted to the first external circuit is not generated in the photoelectric conversion part 2, the electromotive force generated in the photoelectric conversion part 2 can be outputted to the first electrolysis electrode 8 and the second electrolysis electrode 7.

The changeover part 10 can also make a changeover of the circuit based upon the magnitude of the electromotive force of the second external circuit. Therefore, when the power supplied from the second external circuit becomes larger than the electrical needs, the first gas and the second gas can be produced by utilizing the power supplied from the second external circuit.

12. Changeover Selecting Part

The changeover selecting part 21 can select the circuit to be changed by the changeover part 10, and can output the selected result to the changeover part 10. Thus, the changeover selecting part 21 can output a signal for allowing the changeover part 10 to make a changeover of the circuit according to a situation.

The changeover selecting part 21 can select the circuit to be changed by the changeover part 10 based upon at least any one of a predicted amount of solar radiation irradiated to the solar-cell-integrated gas production device 25, a rainfall probability, time and date, ambient temperature, and a power demand estimate. The changeover selecting part 21 can also select the circuit to be changed by the changeover part 10 based upon the magnitude of the electromotive force generated by irradiating the photoelectric conversion part 2 with light or the magnitude of the electromotive force of the second external circuit. With this, the changeover selecting part 21 can select the circuit to be changed by the changeover part 10 so as to be most suitable for the circumstance.

For example, when it is predicted that the rainfall probability is high, and the amount of solar irradiation irradiated to the solar-cell-integrated gas production device 25 is small, the sufficient power satisfying the power demand cannot be supplied even if the electromotive force generated in the photoelectric conversion part 2 is supplied to the first external circuit as the power. In this case, the solar-cell-integrated gas production device 25 can decompose the electrolytic solution to generate hydrogen and the like, since the changeover selecting part 21 selects the circuit that outputs the electromotive force generated in the photoelectric conversion part 2 to the first electrolysis electrode 8 and the second electrolysis electrode 7. Accordingly, the fuel cell can generate power by using the hydrogen gas, which is fully stored, as the fuel, whereby the power sufficiently satisfying the power demand can be supplied to the first external circuit.

When a thermal demand of a facility provided with the solar-cell-integrated gas production device 25 is high due to the low temperature or excessive use of hot water, for example, the changeover selecting part 21 can select the circuit that outputs the electromotive force generated in the photoelectric conversion part 2 to the first electrolysis electrode 8 and the second electrolysis electrode 7. With this, the solar-cell-integrated gas production device 25 can decompose the electrolytic solution to generate hydrogen gas and the like, whereby the facility can utilize heat by using a heat source that employs hydrogen gas as a fuel.

When the power demand of a facility provided with the solar-cell-integrated gas production device 25 is low, for example, the changeover selecting part 21 can select the circuit that outputs the electromotive force generated in the photoelectric conversion part 2 to the first electrolysis electrode 8 and the second electrolysis electrode 7. With this, the solar-cell-integrated gas production device 25 can decompose the electrolytic solution to generate hydrogen gas and the like, thereby being capable of storing energy as hydrogen gas.

The factors for determining which circuit is selected by the changeover selecting part 21 described above may be plural. If there are plural factors, the changeover selecting part 21 can determine the circuit to be changed by comprehensively considering the plural factors for the determination.

The changeover selecting part 21 can receive a signal transmitted from a domestic Smart meter, a signal transmitted from a power company, or a signal provided through an information network such as Internet, and can select the circuit to be changed by the changeover part 10 based upon the signal.

The changeover selecting part 21 can receive the signal wiredly or wirelessly.

13. Electrolytic Solution Chamber

The electrolytic solution chamber 15 is provided to be capable of storing the electrolytic solution into which the first electrolysis electrode 8 or the second electrolysis electrode 7 is immersed. With this configuration, the first electrolysis electrode 8 or the second electrolysis electrode 7 can be immersed into the electrolytic solution, and the electrolysis reaction of the electrolytic solution can be progressed on the surface of the first electrolysis electrode 8 and the second electrolysis electrode 7. The electrolytic solution chamber 15 can be a space between the first and second electrolysis electrodes 8 and 7 and the back substrate 14.

The electrolytic solution chamber 15 can be a channel for collecting the first gas generated from the first electrolysis electrode 8 and the second gas generated from the second electrolysis electrode 7.

14. Back Substrate

The back substrate 14 can be provided over the first electrolysis electrode 8 and the second electrolysis electrode 7 so as to be opposed to the light-transmitting substrate 1. In addition, the back substrate 14 can be provided such that a space is provided between the first electrolysis electrode 8 or the second electrolysis electrode 7, and the back substrate 14. This space can be formed as the electrolytic solution chamber 15.

In addition, the back substrate 14 can be a part of an outer case that can accommodate the photoelectric conversion part 2, the first electrolysis electrode 8, and the second electrolysis electrode 7, and can form the electrolytic solution chamber 15.

In addition, the back substrate 14 constitutes the electrolytic solution chamber 15 and is provided to confine the generated hydrogen gas and oxygen gas, so that it is made of a material having high air leakage efficiency. The back substrate 14 is not limited to be transparent or opaque. The back substrate 14 may be a transparent rigid material such as quartz glass, Pyrex (registered trademark), or a synthetic quartz plate, a transparent resin plate, or a transparent resin film. Among them, the glass material is preferably used because it does not transmit a gas and it is stable chemically and physically.

When the outer case is used for the back substrate 14, it is preferable that the outer case is made of a steel material such as stainless steel, a ceramic such as zirconia or alumina, or a synthetic resin such as phenolic resin, melamine resin (MF), or glass-reinforced polyamide resin.

15. Partition Wall

The partition wall 13 can be provided to separate the electrolytic solution chamber 15 that is a space between the first electrolysis electrode 8 and the back substrate 14, and the electrolytic solution chamber 15 that is a space between the second electrolysis electrode 7 and the back substrate 14. Thus, the first gas and the second gas generated in the first electrolysis electrode 8 and the second electrolysis electrode 7 are prevented from being mixed, so that the first gas and the second gas can be separately collected.

In addition, the partition wall 13 may contain an ion exchanger. In this case, it can equalize an ion concentration which became unbalanced between the electrolytic solution in the electrolytic solution chamber 15 between the first electrolysis electrode 8 and the back substrate 14, and the electrolytic solution in the electrolytic solution chamber 15 between the second electrolysis electrode 7 and the back substrate 14. That is, ions are moved through the partition wall 13 to eliminate the imbalance in ion concentration caused by the electrolysis reaction on the first electrolysis electrode 8 and the second electrolysis electrode 7. When hydrogen gas and oxygen gas are generated by the electrolysis reaction of $H_2O$ on the first electrolysis electrode 8 and the second electrolysis electrode 7, the imbalance in proton can be eliminated, if the partition wall 13 contains an ion exchanger.

When the electrolytic solution is electrolyzed to generate hydrogen gas and oxygen gas, a ratio between a hydrogen generation amount and an oxygen generation amount from the electrolytic solution is 2:1 in molar ratio, and a gas generation amounts differ between the first electrolysis electrode 8 and the second electrolysis electrode 7. Therefore, with a view to keep a water content in the device constant, the partition wall 13 is preferably made of a material which transmits water.

The partition wall 13 may be an inorganic film made of porous glass, porous zirconia, or porous alumina, or an ion exchanger. The ion exchanger may be any well-known ion exchanger, such as a proton-conducting film, cation-exchanging film, or anion-exchanging film.

A material for the proton-conducting film is not limited in particular as long as it has proton-conducting and electrically insulating properties, such as a polymer film, inorganic film, or composite film.

The polymer film may be a perfluoro sulfonate series electrolytic film such as Nafion (registered trademark) made by Du Pont, Aciplex (registered trademark) made by Asahi Kasei Corporation, or Flemion (registered trademark) made by Asahi Glass Co., Ltd., or a carbon hydride series electrolytic film formed of polystyrene sulfonate, sulfonated polyether ether ketone, or the like.

The inorganic film may be a film made of glass phosphate, cesium hydrogen sulfate, polytungsto phosphate, ammonium polyphosphate, or the like. The composite film is formed of an inorganic substance such as a sulfonated polyimide series polymer, or tungsten acid, and an organic substance such as polyimide, and more particularly, GORE-SELECT (registered trademark) made by Gore & Associates Inc., a pore-filling electrolytic film, or the like. Furthermore, when it is used in a high-temperature atmosphere (such as 100° C. or more), the material may be sulfonated polyimide, 2-acrylamide-2-methylpropane sulfonate (AMPS), sulfonated polybenzimidazole, phosphonated polybenzimidazole, cesium hydrogen sulfate, ammonium polyphosphate, or the like.

The cation-exchanging film may be a solid polymer electrolyte which can move cation. More specifically, it may be a fluorine series ion-exchanging film such as a perfluoro carbon sulfonate film or perfluoro carbon carboxylic acid film, a poly-benz-imidazole film impregnated with phosphoric acid, a polystyrene sulfonate film, a sulfonated styrene-vinylbenzene copolymer film, or the like.

When an anion transport number in the support electrolytic solution is high, the anion-exchanging film is preferably used. As the anion-exchanging film, a solid polymer electrolyte which can move anion can be used. More specifically, it may be a polyortho phenylenediamine film, a fluorine series ion-exchanging film having an ammonium salt derivative group, a vinylbenzene polymer film having an ammonium salt derivative group, a film aminated with chloromethylstyrene-vinylbenzene copolymer, or the like.

When the hydrogen generation and the oxygen generation are selectively performed by the hydrogen generation catalyst and the oxygen generation catalyst, respectively, and the ions are moved accordingly, a member such as the specific film for the ion exchange is not always necessary. When the gas is only to be separated physically, an ultraviolet curing resin or thermal curing resin, which will be described below in the seal material, can be used.

16. Seal Material

The seal material 16 is the material to bond the light-transmitting substrate 1 and the back substrate 14, and to seal the electrolytic solution chamber 15. When the box-like back substrate 14 is employed, the seal material 16 is used to bond the box and the light-transmitting substrate 1. The seal material 16 is preferably an ultraviolet curing adhesive or a thermal curing adhesive, but its kind is not limited. The ultraviolet curing adhesive is a resin which polymerizes by being irradiated with a light having a wavelength of 200 to 400 nm and cures in several seconds after being irradiated, and is divided into a radical polymerization type and a cation polymerization type, and the radical polymerization type resin is formed of acrylate or unsaturated polyester, and the cation polymerization type is formed of epoxy, oxetane, or vinyl ether. In addition, the thermal curing polymer adhesive may be an organic resin such as a phenol resin, epoxy resin, melamine resin, urea resin, or thermal curing polyimide. The thermal curing polymer adhesive successfully bonds the members by being heated and polymerizing under a pressed condition at the time of thermal compression and then being cooled down to room temperature while kept being pressed, so that a fastening member is not needed. In addition to the organic resin, a hybrid material having high adhesion to the glass substrate can be used. By using the hybrid material, mechanical characteristics such as elasticity and hardness are improved, and thermal resistance and chemical resistance can be considerably improved. The hybrid material is formed of inorganic colloidal particles and an organic binder resin. For example, it is formed of the inorganic colloidal particles such as silica, and the organic binder resin such as an epoxy resin, polyurethane acrylate resin, or polyester acrylate resin.

Here, the seal material 16 is shown, but this is not limited as long as it has a function to bond the substrate 1 and the back substrate 14, so that a method in which physical pressure is applied from the outside with a member such as a screw using a resin or metal gasket may be occasionally used to enhance the air tightness.

17. Water Intake, First Gas Exhaust Opening, and Second Gas Exhaust Opening

The water intake 18 can be provided by opening a part of the seal material 16 in the solar-cell-integrated gas production device 25. The water intake 18 is arranged to supply the electrolytic solution to the electrolytic solution chamber 15, and its position and shape are not limited in particular as long as the electrolytic solution can be efficiently supplied to the solar-cell-integrated gas production device 25, but it is preferably provided at a lower part of the solar-cell-integrated gas production device 25 in view of flowability and easiness of supply.

In addition, the first gas exhaust opening 20 and the second gas exhaust opening 19 can be provided by opening the seal material 16 on an upper part of the solar-cell-integrated gas production device 25 after the solar-cell-integrated gas production device 25 has been set as being tilted. In addition, the first gas exhaust opening 20 and the second gas exhaust opening 19 can be provided on the side of the first electrolysis electrode and on the side of the second electrolysis electrode across the partition wall 13, respectively.

By providing the water intake 18, the first gas exhaust opening 20, and the second gas exhaust opening 19 as described above, the solar-cell-integrated gas production device 25 can be set such that the light acceptance surface of the photoelectric conversion part 2 is tilted with respect to a horizontal surface under the condition that it faces upward, and the water intake 18 is positioned on the lower side, and the first gas exhaust opening 20 and the second gas exhaust opening 19 are positioned on the upper side. In this setting, the electrolytic solution can be introduced from the water intake 18 into the solar-cell-integrated gas production device 25, and the electrolytic solution chamber 15 is filled with the electrolytic solution. When light enters the solar-cell-integrated gas production device 25 in this state, and the electromotive force on the photoelectric conversion part 2 is outputted to the first electrolysis electrode 8 and the second electrolysis electrode 7 by the changeover part 10, the first gas and the second gas are sequentially generated in the first electrolysis electrode 8 and the second electrolysis electrode 7, respectively. The generated first gas and the second gas can be separated by the partition wall 13, and the first gas and the second gas rise to the upper part of the solar-cell-integrated gas production device 25 and are collected from the first gas exhaust opening 20 and the second gas exhaust opening 19.

18. Electrolytic Solution

The electrolytic solution is the water solution containing the electrolyte such as an electrolytic solution containing 0.1M of $H_2SO_4$, or a buffering solution containing 0.1 M of potassium phosphate. The type of the electrolyte is not limited in particular, so long as the ion movement for the gas generation reaction is caused, and the concentration of the electrolyte is not limited in particular.

DESCRIPTION OF SYMBOLS

1: light-transmitting substrate, 2: photoelectric conversion part, 4: first electrode, 5: second electrode, 7: second electrolysis electrode, 8: first electrolysis electrode, 9: first conductive part, 10: changeover part, 11: insulation part, 13: partition wall, 14: back substrate, 15: electrolytic solution chamber, 16: seal material, 18: water intake, 19: second gas exhaust opening, 20: first gas exhaust opening, 21: changeover selecting part, 22: output terminal, 23: input terminal, 24a, 24b, 24c: wiring, 25: solar-cell-integrated gas production device, 27: electrolytic solution, 28: photoelectric conversion layer, 29: second conductive part, 30: light-transmitting electrode, 31: back electrode, 33: third conductive part, 35: semiconductor part, 36: p-type semiconductor part, 37: n-type semiconductor part, 40: isolation

The invention claimed is:

1. A solar-cell-integrated gas production device comprising:
   a photoelectric conversion part having a light acceptance surface and its back surface;
   a first electrolysis electrode provided on the back surface of the photoelectric conversion part so as to be capable of being immersed into an electrolytic solution;
   a second electrolysis electrode provided on the back surface of the photoelectric conversion part so as to be capable of being immersed into the electrolytic solution; and
   a changeover part, wherein
   the first electrolysis electrode and the second electrolysis electrode are provided to be capable of electrolyzing the electrolytic solution to generate a first gas and a second gas by utilizing an electromotive force generated by irradiating the photoelectric conversion part with light, and
   the changeover part makes a changeover between a circuit that outputs the electromotive force, generated by irradiating the photoelectric conversion part with light, to a first external circuit, and a circuit that outputs the electromotive force, generated by irradiating the photoelectric conversion part with light, to the first electrolysis electrode and the second electrolysis electrode.

2. The device according to claim 1, wherein one of the first gas and the second gas is hydrogen gas, and the other is oxygen gas.

3. The device according to claim 1, further comprising an insulation part provided on the back surface of the photoelectric conversion part, wherein the first electrolysis electrode and the second electrolysis electrode are provided on the insulation part and are electrically connected to the changeover part respectively.

4. The device according to claim 1, further comprising an insulation part provided on the back surface of the photoelectric conversion part, wherein
   the second electrolysis electrode is provided on the insulation part and is electrically connected to the changeover part, and
   the first electrolysis electrode is provided on the back surface of the photoelectric conversion part and is electrically connected to the back surface of the photoelectric conversion part.

5. The device according to claim 1, further comprising a first electrode formed on the light acceptance surface of the photoelectric conversion part, and an insulation part provided on the back surface of the photoelectric conversion part, wherein
   the second electrolysis electrode is provided on the insulation part and is electrically connected to the first electrode, and
   the first electrolysis electrode is provided on the insulation part and is electrically connected to the changeover part.

6. The device according to claim 1, further comprising a first electrode formed on the light acceptance surface of the photoelectric conversion part, and an insulation part provided on the back surface of the photoelectric conversion part, wherein
   the second electrolysis electrode is provided on the insulation part and is electrically connected to the first electrode, and
   the first electrolysis electrode is provided on the back surface of the photoelectric conversion part and is electrically connected to the back surface of the photoelectric conversion part.

7. The device according to claim 5, further comprising a first conductive part that electrically connects the second electrolysis electrode and the first electrode.

8. The device according to claim 7, wherein the first conductive part is provided on a contact hole that penetrates the photoelectric conversion part.

9. The device according to claim 7, wherein
   the insulation part is provided to cover the side face of the photoelectric conversion part, and
   the first conductive part is provided on a portion that is a part of the insulation part and that covers the side face of the photoelectric conversion part.

10. The device according to claim 5, wherein
    the insulation part is provided to cover the side face of the photoelectric conversion part, and
    the second electrolysis electrode is provided on a portion that is a part of the insulation part and covers the side face of the photoelectric conversion part, and the second electrolysis electrode contacts with the first electrode.

11. The device according to claim 1, further comprising a first electrode provided on the light acceptance surface of the photoelectric conversion part, and a second electrode provided on the back surface of the photoelectric conversion part, wherein the first electrode and the second electrode are electrically connected to the changeover part.

12. The device according to claim 1, wherein when being irradiated with light, the photoelectric conversion part generates a potential difference between first and second regions on the back surface of the photoelectric conversion part, wherein
    the first region is formed to be electrically connected to the first electrolysis electrode, and
    the second region is formed to be electrically connected to the second electrolysis electrode.

13. The device according to claim 12, wherein the photoelectric conversion part is formed of at least one semiconductor material having an n-type semiconductor part and a p-type semiconductor part, wherein
    one of the first and second regions is a part of the n-type semiconductor part, while the other is a part of the p-type semiconductor part.

14. The device according to claim 1, further comprising a back substrate provided on the side of the back surface of the photoelectric conversion part, wherein
    the second electrolysis electrode is provided on the back substrate and is electrically connected to the changeover part, and
    the first electrolysis electrode is provided on the back surface of the photoelectric conversion part and is electrically connected to the back surface of the photoelectric conversion part.

15. The device according to claim 1, further comprising an electrolytic solution chamber that can store the electrolytic solution into which the first electrolysis electrode or the second electrolysis electrode can be immersed.

16. The device according to claim 1, wherein one of the first electrolysis electrode and the second electrolysis electrode is a hydrogen generation part to generate $H_2$ from the electrolytic solution, and the other is an oxygen generation part to generate $O_2$ from the electrolytic solution, wherein
    the hydrogen generation part and the oxygen generation part respectively contain a catalyst of a reaction to generate $H_2$ from the electrolytic solution and a catalyst of a reaction to generate $O_2$ from the electrolytic solution.

17. The device according to claim 16, wherein at least one of the hydrogen generation part and the oxygen generation part is formed of a catalyst-supporting porous conductor.

18. The device according to claim 1, wherein the changeover part can electrically be connected to a second external circuit, and can make a changeover to a circuit that outputs the electromotive force inputted from the second external circuit to the first electrolysis electrode and the second electrolysis electrode to generate the first gas and the second gas respectively from the electrolytic solution.

19. The device according to claim 1, further comprising a changeover selecting part that selects the circuit to be changed by the changeover part, and outputs the selected result to the changeover part, wherein the changeover part makes a changeover based upon the inputted result selected by the changeover selecting part.

20. The device according to claim 19, wherein the changeover selecting part selects the circuit to be changed by the changeover part based upon at least one of a predicted amount of solar radiation irradiated to the device, a rainfall probability, time and date, ambient temperature, and a power demand estimate.

* * * * *